US006559491B2

(12) United States Patent     (10) Patent No.: US 6,559,491 B2
Forbes et al.     (45) Date of Patent: May 6, 2003

(54) FOLDED BIT LINE DRAM WITH ULTRA THIN BODY TRANSISTORS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 09/780,130

(22) Filed: Feb. 9, 2001

(65) Prior Publication Data

US 2002/0109173 A1 Aug. 15, 2002

(51) Int. Cl.$^7$ .............................................. H01L 27/108
(52) U.S. Cl. ........................ 257/296; 257/328; 257/347
(58) Field of Search ................................. 257/296, 297, 257/298, 299, 300, 301, 302, 303, 304, 305, 306, 307, 308, 309, 310, 311, 312, 313, 327, 328, 329, 330, 331, 332, 347

(56) References Cited

U.S. PATENT DOCUMENTS

| | | | |
|---|---|---|---|
| 5,691,230 A | 11/1997 | Forbes | ........................ 437/62 |
| 5,952,039 A | * 9/1999 | Hong | |
| 6,072,209 A | 6/2000 | Noble et al. | ................. 257/296 |
| 6,150,687 A | 11/2000 | Noble et al. | ................. 257/302 |
| 6,174,784 B1 | 1/2001 | Forbes | ........................ 438/405 |
| 6,252,267 B1 | * 6/2001 | Noble, Jr. | |

OTHER PUBLICATIONS

Hergenrother, J.M., "The Vertical Replacement–Gate (VRG) MOSFET: A 50nm Vertical MOSFET with Lithography–Independent Gate Length", *IEEE*, pp. 75–78, (1999).

Kalavade, P., et al., "A Novel sub–10nm Transistor", *IEEE Device Research Conference*, Denver, Co., pp. 71–72, (2000).

Xuan, P., et al., "60nm Planarized Ultra–thin Body Solid Phase Epitaxy MOSFETs", *IEEE Device Research Conference*, Denver, CO, pp. 67–68, (2000).

* cited by examiner

*Primary Examiner*—Nathan J. Flynn
*Assistant Examiner*—Kevin Quinto
(74) *Attorney, Agent, or Firm*—Schwegman, Lundberg, Woessner & Kluth, P.A.

(57) ABSTRACT

A folded bit line DRAM device is provided. The folded bit line DRAM device includes an array of memory cells. Each memory cell in the array of memory cells includes a pillar extending outwardly from a semiconductor substrate. Each pillar includes a single crystalline first contact layer and a single crystalline second contact layer separated by an oxide layer. A single crystalline vertical transistor is formed along alternating sides of the pillar within a row of pillars. The single crystalline vertical transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A plurality of buried bit lines are formed of single crystalline semiconductor material and disposed below the pillars in the array memory cells for interconnecting with the first contact layer of column adjacent pillars in the array of memory cells. Further, a plurality of word lines are included. Each word line is disposed orthogonally to the plurality of buried bit lines in a trench between rows of the pillars for addressing alternating body regions of the single crystalline vertical transistors that are adjacent to the trench.

38 Claims, 16 Drawing Sheets

FOLDED BIT LINE DRAM WITH ULTRA THIN BODY TRANSISTORS

CROSS REFERENCE TO RELATED APPLICATIONS

This application is related to the following co-pending, commonly assigned U.S. patent applications: "Open Bit Line DRAM with Ultra Thin Body Transistors," Ser. No. 09/780,125, "Flash Memory with Ultra Thin Vertical Body Transistors," Ser. No. 09/780,169, now U.S. Pat. No. 6,424,001, "Programmable Logic Arrays with Ultra Thin Body Transistors," Ser. No. 09/780,087, and "Memory Address and Decode Circuits with Ultra Thin Body Transistors," Ser. No. 09/780,144, now U.S. Pat. No. 6,448,601, "Programmable Memory Address and Decode Circuits with Ultra Thin Body Transistors," Ser. No. 09/780,126, "In Service Programmable Logic Arrays with Ultra Thin Body Transistors," Ser. No. 09/780,129, now U.S. Pat. No. 6,377,070, which are filed on even date herewith and each of which disclosure is herein incorporated by reference.

FIELD OF THE INVENTION

The present invention relates generally to integrated circuits, and in particular to folded bit line DRAM with ultra thin body transistors.

BACKGROUND OF THE INVENTION

Semiconductor memories, such as dynamic random access memories (DRAMs), are widely used in computer systems for storing data. A DRAM memory cell typically includes an access field-effect transistor (FET) and a storage capacitor. The access FET allows the transfer of data charges to and from the storage capacitor during reading and writing operations. The data charges on the storage capacitor are periodically refreshed during a refresh operation.

Memory density is typically limited by a minimum lithographic feature size (F) that is imposed by lithographic processes used during fabrication. For example, the present generation of high density dynamic random access memories (DRAMs), which are capable of storing 256 Megabits of data, require an area of $8F^2$ per bit of data. There is a need in the art to provide even higher density memories in order to further increase data storage capacity and reduce manufacturing costs. Increasing the data storage capacity of semiconductor memories requires a reduction in the size of the access FET and storage capacitor of each memory cell. However, other factors, such as subthreshold leakage currents and alpha-particle induced soft errors, require that larger storage capacitors be used. Thus, there is a need in the art to increase memory density while allowing the use of storage capacitors that provide sufficient immunity to leakage currents and soft errors. There is also a need in the broader integrated circuit art for dense structures and fabrication techniques.

As the density requirements become higher and higher in gigabit DRAMs and beyond, it becomes more and more crucial to minimize cell area. One possible DRAM architecture is the folded bit line structure.

The continuous scaling, however, of MOSFET technology to the deep sub-micron region where channel lengths are less than 0.1 micron, 100 nm, or 1000 A causes significant problems in the conventional transistor structures. As shown in FIG. 1, junction depths should be much less than the channel length of 1000 A, or this implies junction depths of a few hundred Angstroms. Such shallow junctions are difficult to form by conventional implantation and diffusion techniques. Extremely high levels of channel doping are required to suppress short-channel effects such as drain-induced barrier lowering; threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus making the channel shorter to improve performance is negated by lower carrier mobility.

Therefore, there is a need in the art to provide improved memory densities while avoiding the deleterious effects of short-channel effects such as drain-induced barrier lowering; threshold voltage roll off, and sub-threshold conduction, increased leakage and reduced carrier mobility. At the same time charge storage retention time must be maintained.

SUMMARY OF THE INVENTION

The above mentioned problems with semiconductor memories and other problems are addressed by the present invention and will be understood by reading and studying the following specification. Systems and methods are provided for transistors with ultra thin bodies, or transistors where the surface space charge region scales down as other transistor dimensions scale down.

In one embodiment of the present invention, a folded bit line DRAM device is provided. The folded bit line DRAM device includes an array of memory cells. Each memory cell in the array of memory cells includes a pillar extending outwardly from a semiconductor substrate. Each pillar includes a single crystalline first contact layer and a single crystalline second contact layer separated by an oxide layer. A single crystalline vertical transistor is formed along alternating sides of the pillar within a row of pillars. The single crystalline vertical transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A plurality of buried bit lines are formed of single crystalline semiconductor material and disposed below the pillars in the array memory cells for interconnecting with the first contact layer of column adjacent pillars in the array of memory cells. Further, a plurality of word lines are included. Each word line is disposed orthogonally to the plurality of buried bit lines in a trench between rows of the pillars for addressing alternating body regions of the single crystalline vertical transistors that are adjacent to the trench.

The invention also provides a method of fabricating a method for forming a folded bit line DRAM device. The method includes forming an array of memory cells formed in rows and columns. Forming each memory cell includes forming a pillar extending outwardly from a semiconductor substrate. Forming each pillar includes forming a single crystalline first contact layer of a first conductivity type and forming a single crystalline second contact layer of the first conductivity type vertically separated by an oxide layer. Forming each memory cell further includes forming a single crystalline vertical transistor along alternating sides of the pillar within a row of pillars. According to the teachings of the present invention forming each single crystalline vertical transistor includes depositing a lightly doped polysilicon layer of a second conductivity type over the pillar and directionally etching the polysilicon layer of the second conductivity type to leave only on sidewalls of the pillars. Forming each single crystalline vertical transistor includes annealing the pillar such that the lightly doped polysilicon layer of the second conductivity type recrystallizes and lateral epitaxial solid phase regrowth occurs vertically to form a single crystalline vertically oriented material of the second conductivity type. Furhter, the annealing causes the single crystalline first and second contact layers of a first conductivity type seed a growth of single crystalline material of the first conductivity type into the lightly doped polysilicon layer of the second type to form vertically oriented first and second source/drain regions of the first conductivity type separated by the now single crystalline vertically oriented material of the second conductivity type Forming the folded bit line DRAM device further includes forming a plurality of buried bit lines formed of single crystalline semiconductor material and disposed below the pillars in the array of memory cells. Forming the plurality of buried bit lines includes coupling the first contact layer of column adjacent pillars in the array of memory cells. The method further includes forming a plurality of word lines. According to the teachings of the present invention forming the plurality of word lines includes forming each word line disposed orthogonally to the plurality of buried bit lines in a trench between rows of the pillars for addressing alternating body regions of the single crystalline vertical transistors that are adjacent to the trench.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
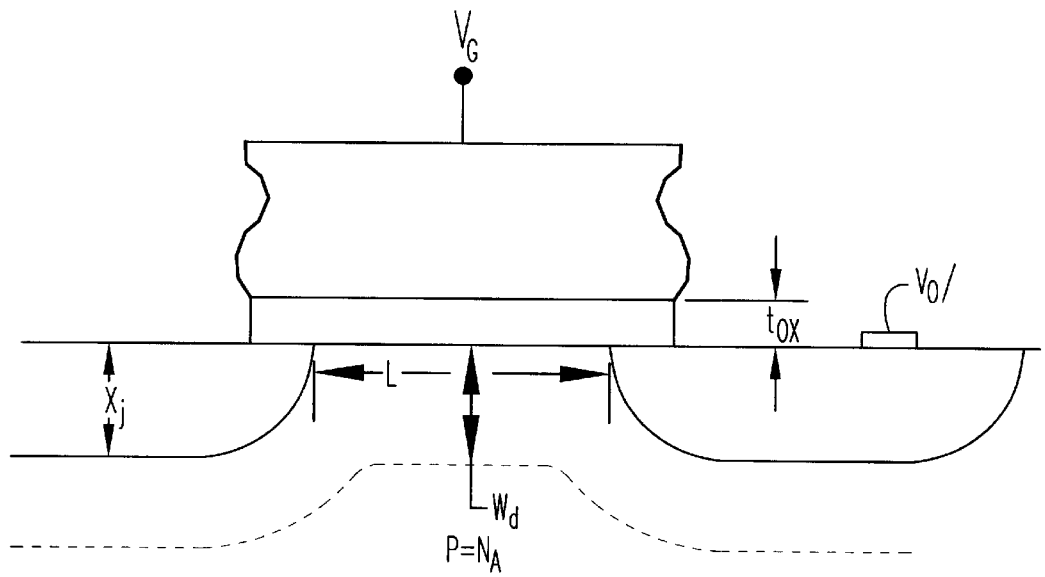
FIG. 1 is an illustration of a convention MOSFET transistor illustrating the shortcomings of such conventional MOSFETs as continuous scaling occurs to the deep submicron region where channel lengths are less than 0.1 micron, 100 nm, or 1000 A.
Figure 2A:
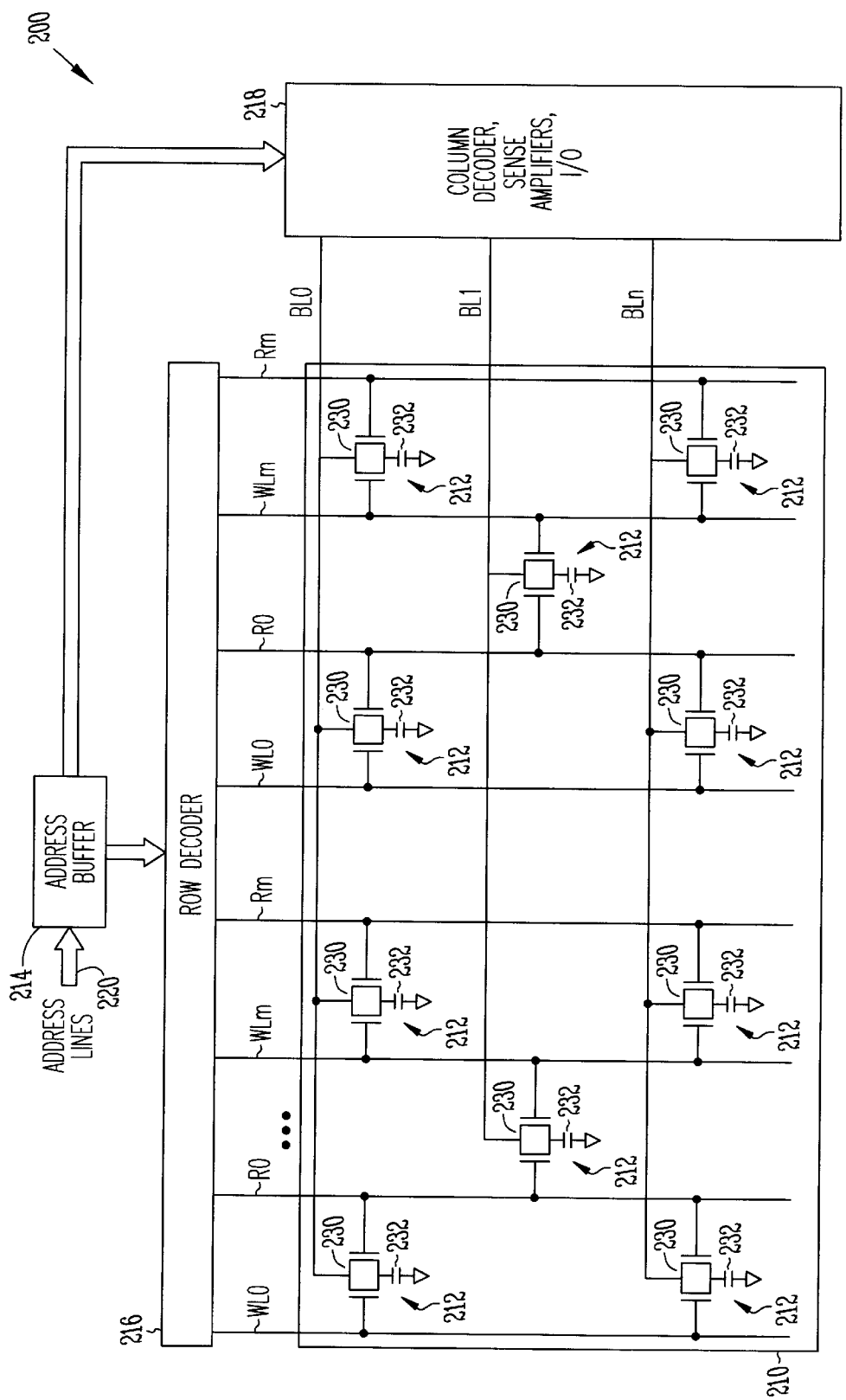
FIG. 2A is a diagram illustrating generally one embodiment of a folded bit line DRAM with vertical ultra thin body transistors according to the teachings of the present invention.

FIG. 2A is a diagram illustrating generally one embodiment of a folded bit line DRAM with vertical ultra thin body transistors according to the teachings of the present invention. In general, FIG. 2A shows an integrated circuit 200, such as a semiconductor memory device, incorporating an array of memory cells provided by the invention. As shown in FIG. 2A, circuit 200 includes memory cell arrays 210, such as 210A and 210B. Each array 210 includes M rows and N columns of memory cells 212.

In the embodiment of FIG. 2A, each memory cell includes a transfer device, such as n-channel cell access field-effect transistor (FET) 230. More particularly, access FET 230 includes at least one, but may include two, gates for controlling conduction between the access FET's 230 first and second source/drain terminals.

Figure 2B:
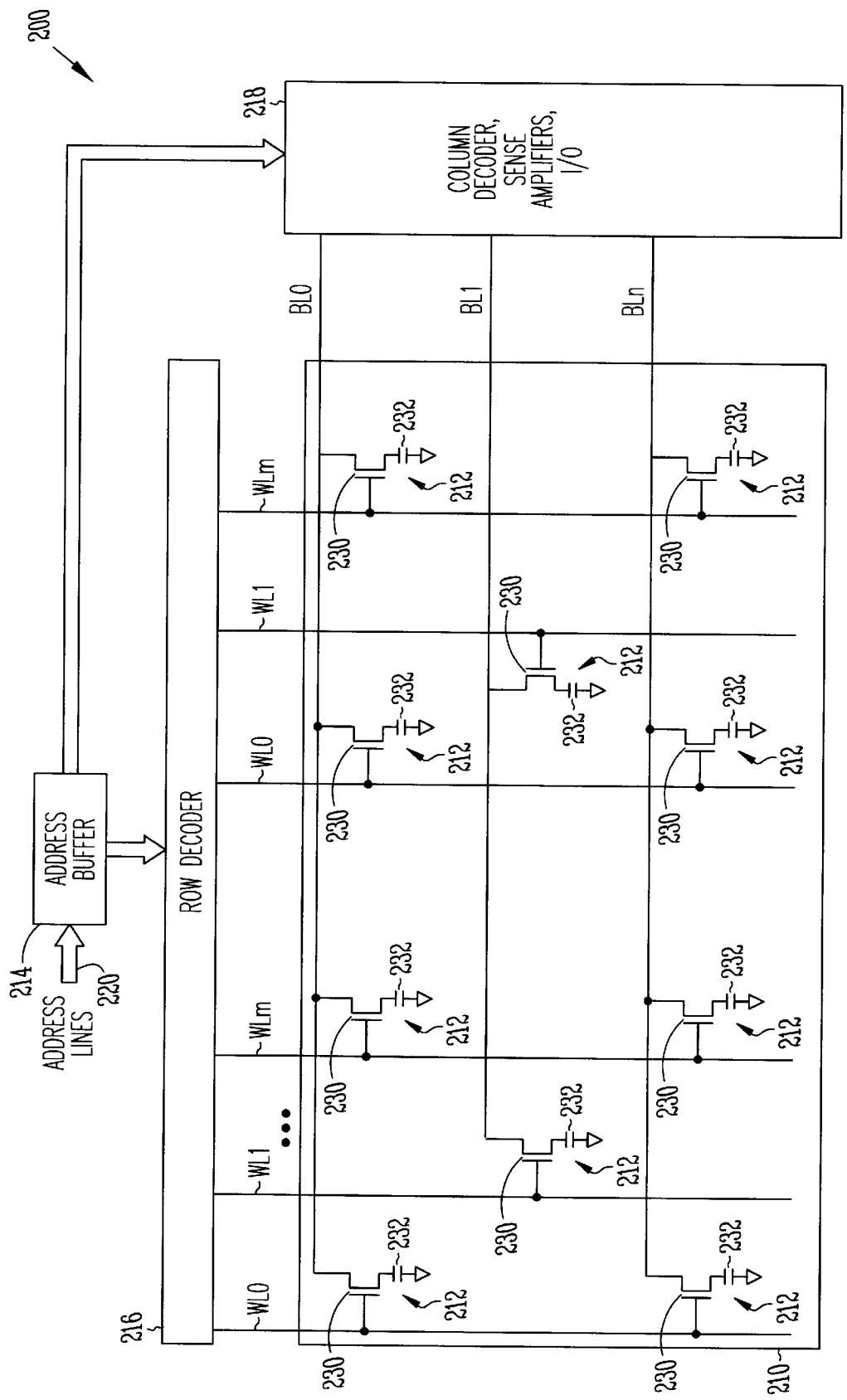
FIG. 2B illustrates an embodiment of the present invention for a folded bit line architecture practiced having a single wordline/gate per vertical ultra thin body transistors formed on opposing sides of pillars according to the teachings of the present invention.

Access FET 230 is coupled at a second source/drain terminal to a storage node of a storage capacitor 232. The other terminal of storage capacitor 232 is coupled to a reference voltage such as a ground voltage VSS. Each of the M rows includes one of word lines WL0, WL1 ... WLm-1, WLm which serve as or are coupled to a first gate in alternating row adjacent access FETs 230. In the embodiment shown in FIG. 2A, each of the M rows also includes one of word lines R0, R2, ... , Rm-1, Rm coupled to a second gate in alternating row adjacent access FETs 230 in memory cells 212. As one of ordinary skill in the art will understand upon reading this disclosure, two wordlines per access FET 230 are not required to practice the invention, but rather represent one embodiment for the same. The invention may be practiced having a single wordline/gate per alternating row adjacent access FET 230 and the same is illustrated in FIG. 2B. The invention is not so limited. The term wordline includes any interconnection line for controlling conduction between the first and second source/drain terminals of access FETs 230. According to the teachings of the present invention, and as explained in more detail below, access FETs 230 include vertical ultra thin body transistors 230.

Each of the N columns includes one of bit lines BL0, BL1 ... BLn-1, Bln. Bit lines BL0–BLn are used to write to and read data from memory cells 212. Word lines WL0–WLm and R0–RM are used to activate alternating row adjacent access FETs 230 to access a particular row of memory cells 212 that is to be written or read. As shown in FIGS. 2A and 2B, addressing circuitry is also included. For example, address buffer 214 controls column decoders 218, which also include sense amplifiers and input/output circuitry that is coupled to bit lines BL0–BLn. Address buffer 214 also controls row decoders 216. Row decoders 216 and column decoders 218 selectably access memory cells 212 in response to address signals that are provided on address lines 220 during read and write operations. The address signals are typically provided by an external controller such as a microprocessor or other memory controller. Each of memory cells 212 has a substantially identical structure, and accordingly, only one memory cell 212 structure is described herein. The same are described in more detail in connection with FIG. 3.

In one example mode of operation, circuit 200 receives an address of a particular memory cell 212 at address buffer 214. Address buffer 214 identifies one of the word lines WL0–WLm of the particular memory cell 212 to row decoder 216. Row decoder 216 selectively activates the particular word line WL0–WLm to activate access FETs 230 of each memory cell 212 that is connected to the selected word line WL0–WLm. Column decoder 218 selects the one of bit lines BL0–BLn of the particularly addressed memory cell 212. For a write operation, data received by input/output circuitry is coupled to the one of bit lines BL0–BLn and through the access FET 230 to charge or discharge the storage capacitor 232 of the selected memory cell 212 to represent binary data. For a read operation, data stored in the selected memory cell 212, as represented by the charge on its storage capacitor 232, is coupled to the one of bit lines BL0–BLn, amplified, and a corresponding voltage level is provided to the input/output circuits.

According to one aspect of the invention, each of the first and second gates of access FET 230 is capable of controlling the conduction between its first and second source/drain terminals, as described below. In this embodiment, parallel switching functionality can be effected between the first and second source/drain terminals of access FET 230 by independently operating the particular ones of word lines WL0–WLm and corresponding ones of word lines R0–Rm. For example, by independently activating word line WL0 and word line R0, both of which are coupled to the same row of memory cells 212, independently controlled inversion channels can be formed in each corresponding access FET 230 by respective first and second gates for allowing conduction between the first and second source/drain regions.

According to another aspect of the invention, each of the first and second gates of access FET 230 is capable of controlling the conduction between its first and second source/drain terminals, but the first and second gates of particular access FETs 230 are synchronously activated, rather than independently operated. For example, by synchronously activating word line WL0 and word line R0, both of which are coupled to the same row of memory cells 212, synchronously activated inversion channels can be formed in each corresponding access FET 230 by respective first and second gates for allowing conduction between the first and second source/drain regions.

In this embodiment, synchronous activation and deactivation of the first and second gates allows better control over the potential distributions in the access FET 230 when it is in a conductive state. Synchronous activation and deactivation can be used to obtain well-controlled fully depleted operating characteristics of access FET 230.

In a further embodiment in which the first and second gates are either synchronously or independently activated, different activation voltages can be applied to the first and second gates of the access FET 230. For example, different voltages can be provided to synchronously activated word lines WL0 and R0, thereby providing different activation voltages to the first and second gates of the access FET 230 to obtain particular desired operating characteristics. Similarly, different deactivation voltages can be applied to the first and second gates of the access FET 230. For example, different deactivation voltages can be provided to synchronously deactivated word lines WL0 and R0 and corresponding first and second gates of access FETs 230, in order to obtain particular desired operating characteristics. Similarly, different activation and deactivation voltages can be applied to independently operated word lines such as WL0 and R0.

Figure 3:
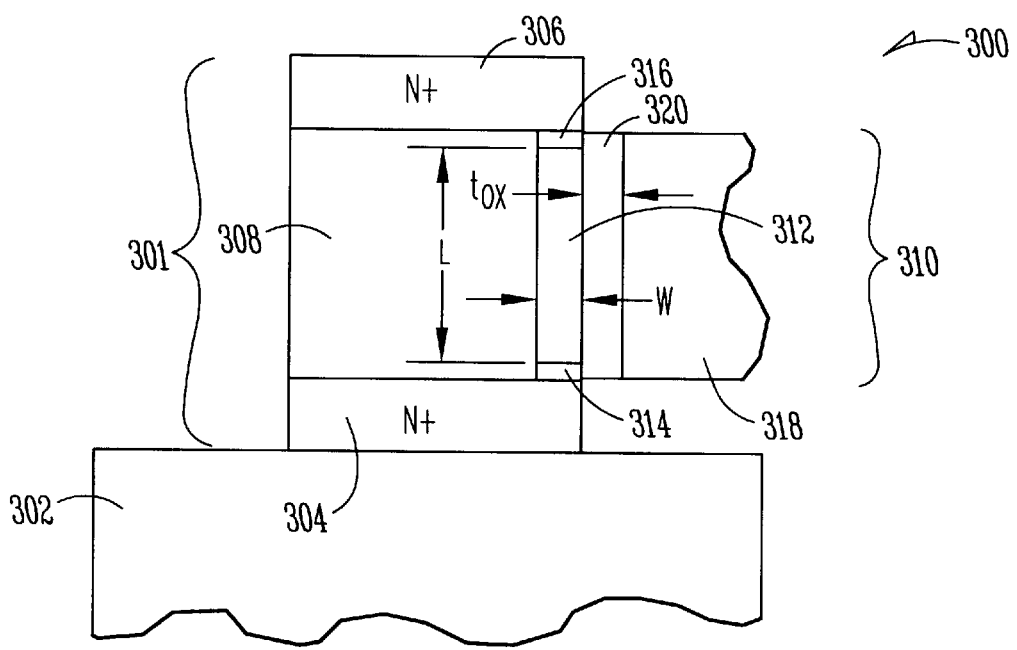
FIG. 3 is a diagram illustrating a vertical ultra thin body transistor formed along side of a pillar according to the teachings of the present invention.

FIG. 3 is a diagram illustrating an access FET 300 formed according to the teachings of the present invention which make up a portion of the memory cells 212 shown in FIGS. 2A and 2B. As shown in FIG. 3, access FET 300 includes a vertical ultra thin body transistor, or otherwise stated an ultra thin single crystalline vertical transistor. According to the teachings of the present invention, the structure of the access FET 300 includes a pillar 301 extending outwardly from a semiconductor substrate 302. The pillar includes a single crystalline first contact layer 304 and a single crystalline second contact layer 306 vertically separated by an oxide layer 308. An ultra thin single crystalline vertical transistor 310 is formed along side of the pillar 301. The ultra thin single crystalline vertical transistor 310 includes an ultra thin single crystalline vertical body region 312 which separates an ultra thin single crystalline vertical first source/drain region 314 and an ultra thin single crystalline vertical second source/drain region 316. A gate 318, which may be integrally formed with a word line as described above and below, is formed opposing the ultra thin single crystalline vertical body region 312 and is separated therefrom by a thin gate oxide layer 320.

According to embodiments of the present invention, the ultra thin single crystalline vertical transistor 310 includes a transistor having a vertical length of less than 100 nanometers and a horizontal width of less than 10 nanometers.

Thus, in one embodiment, the ultra thin single crystalline vertical body region 312 includes a channel having a vertical length (L) of less than 100 nanometers. Also, the ultra thin single crystalline vertical body region 312 has a horizontal width (W) of less than 10 nanometers. And, the ultra thin single crystalline vertical first source/drain region 314 and an ultra thin single crystalline vertical second source/drain region 316 have a horizontal width of less than 10 nanometers. According to the teachings of the present invention, the ultra thin single crystalline vertical transistor 310 is formed from solid phase epitaxial growth.

Figure 4A:
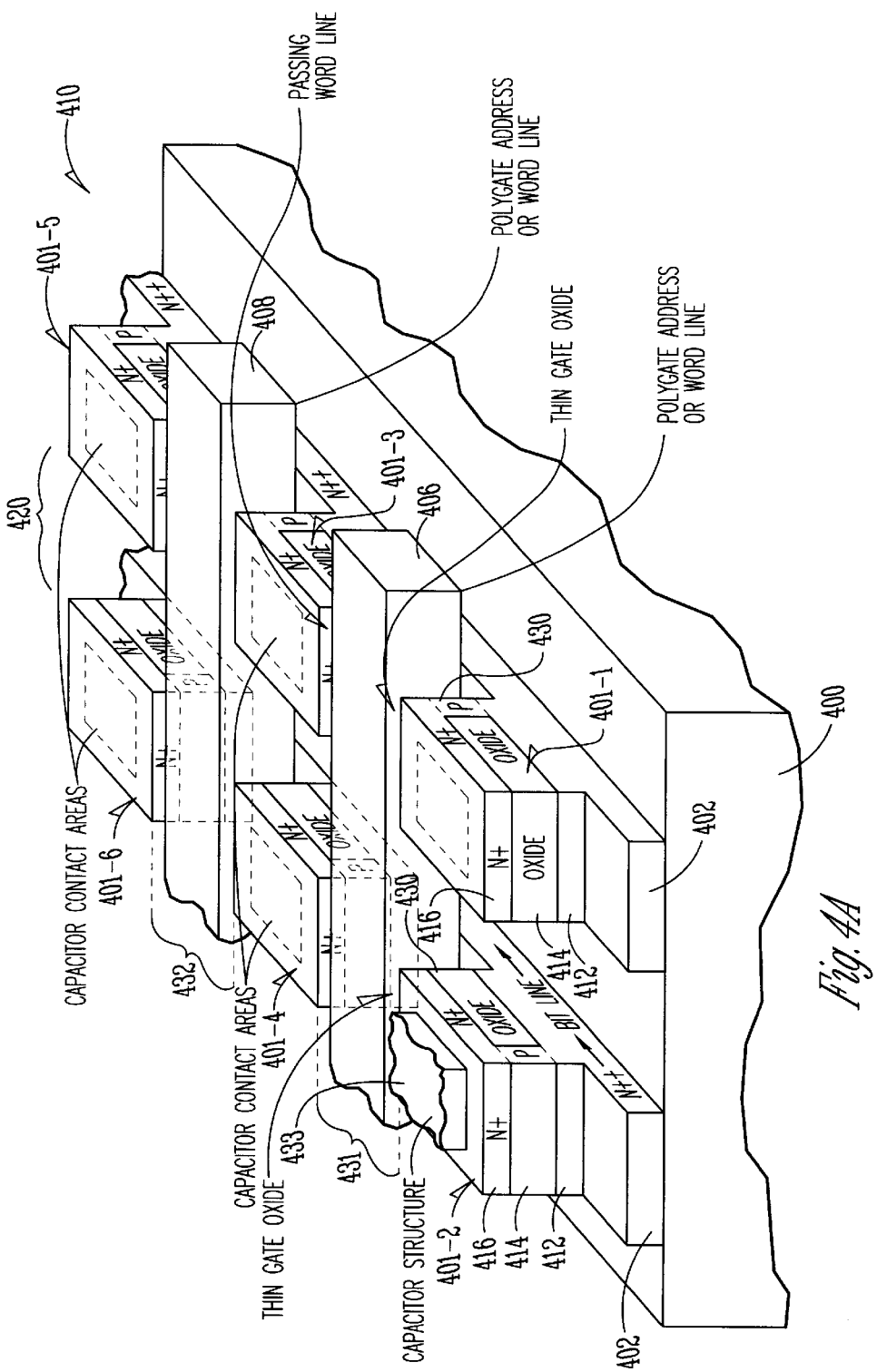
FIG. 4A is a perspective view illustrating generally one embodiment of a portion of a folded bit line memory according to the present invention.

FIG. 4A is a perspective view illustrating generally one embodiment of a portion of a folded bit line memory device or array 410 formed in rows and columns according to the present invention. FIG. 4 illustrates portions of six memory cells 401-1, 401-2, 401-3, 401-4, 401-5, and 401-6 which include ultra thin single crystalline vertical transistors 430. According to the teachings of the present invention, these ultra thin single crystalline vertical transistors 430 are formed, as described in connection with FIG. 3, along side of pillars extending outwardly from a semiconductor substrate 400. These pillars are formed on conductive segments of bit lines 402 which represent particular ones of bit lines BL0–BLn aligned in the column direction. In the embodiment shown in FIG. 4A conductive segments of first word line 406 represents any one of word lines WL0–WLm, which provide integrally formed first gates for ultra thin single crystalline vertical transistors 430 for row adjacent pillars, on one side of a trench in which the particular first word line 406 is interposed. This is thus dependant on the desired circuit configuration as presented in connection with FIG. 2B. Conductive segments of second word line 408 represents any one of word lines WL0–WLm, which provide integrally formed second gates for ultra thin single crystalline vertical transistors 430 for alternating, row adjacent pillars, in a neighboring trench in which the particular second word line 408 is interposed.

As explained in connection with FIG. 3, ultra thin single crystalline vertical transistors 430 are formed alongside of pillars that extend outwardly from an underlying substrate 410. As described below, substrate 400 includes bulk semiconductor starting material, semiconductor-on-insulator (SOI) starting material, or SOI material that is formed from a bulk semiconductor starting material during processing.

FIG. 4A illustrates one example embodiment, using bulk silicon processing techniques. As shown in FIG. 4A, the pillars include an n+silicon layer formed on a bulk silicon substrate 400 to produce first contact layer 412 and integrally formed n++ conductively doped bit lines 402 defining a particular column of memory cells shown as BL0–Bln in FIGS. 2A and 2B. An oxide layer 414 is formed on n+ first contact layer 412. A further n+ silicon layer is formed on oxide layer 414 to produce second contact layer 416 of in the pillars. Storage capacitors 432 are formed on the second contact layers 416 using any suitable technique as the same will be known and understood by one of ordinary skill in the art upon reading this disclosure.

Word lines WL0–WLm are disposed (interdigitated) within the array 410. For example, first word line 406 is interposed in a trench 431 between pillars of 401-1 and 401-3 and between pillars 401-2 and 401-4. Second word line 408 is interposed in a trench 432 between semiconductor pillars of memory cell pairs 401-3 and 401-5 and between pillars 401-4 and 401-6. In the embodiment shown in FIG. 4A, the ultra thin single crystalline vertical transistors 430 which are formed along side of the pillars adjacent to the trenches 431 and 432 in alternating, row adjacent pillars. Accordingly, the folded bit line device is provided with word lines 406 and 408 serving as or addressing gates for transistors 430 in alternating pillars along a row. As shown in FIG. 4A, the ultra thin single crystalline vertical transistors 430 which are formed along side of the pillars are also in contact with bit lines 402 through the first contact layers 412. In this embodiment, bit lines 402 contact bulk semiconductor substrate 400.

Isolation trenches 420, 431 and 432 provide isolation between ultra thin single crystalline vertical transistors 430 of adjacent memory cells 401-1, 401-2, 401-3, 401-4, 401-5, and 401-6. Columns of pillars along a bit line direction are separated by a trench 420 that is subsequently filled with a suitable insulating material such as silicon dioxide. For example, a trench 420 provides isolation between pillars 401-1 and 401-2 and between pillars 401-3 and 401-4. Rows of pillars including the ultra thin single crystalline vertical transistors 430 are alternatingly separated by trenches 431 and 432, each of which contain word lines WL0–WLm as described above. Such word lines WL0–WLm are separated from substrate 400 by an underlying insulating layer, described below. Also, as shown in the embodiment of FIG. 4A, word lines WL0–WLm are separated by a gate oxide from the ultra thin vertically oriented single crystalline body regions of ultra thin single crystalline vertical transistors 430 which are adjacent to the trenches 431 and 432 in alternating row adjacent pillars. Trenches 431 and 432 extend substantially orthogonally to bit lines 402.

In one embodiment, respective first and second word lines 406 and 408 are formed of a refractory metal, such as tungsten or titanium. In another embodiment, first and second word lines 406 and 408 can be formed of n+ doped polysilicon. Similarly, other suitable conductors could also be used for first and second words lines 406 and 408, respectively. One of ordinary skill in the art will further understand upon reading this disclosure that the conductivity types described herein can be reversed by altering doping types such that the present invention is equally applicable to include structures having ultra thin vertically oriented single crystalline p-channel type transistors 430. The invention is not so limited.

Burying first and second word lines 406 and 408 below semiconductor a top surface of the vertical pillars provides additional space on the upper portion of memory cells, 401-1, 401-2, 401-3, 401-4, 401-5, and 401-6, for formation of storage capacitors 432. Increasing the area available for forming storage capacitor 432 increases the possible obtainable capacitance value of storage capacitor 432. In one embodiment, storage capacitor 432 is a stacked capacitor that is formed using any of the many capacitor structures and process sequences known in the art. Other techniques could also be used for implementing storage capacitor 432. Contacts to the first and second word lines 406 and 408, respectively, can be made outside of the memory array 410.

Figure 4B:
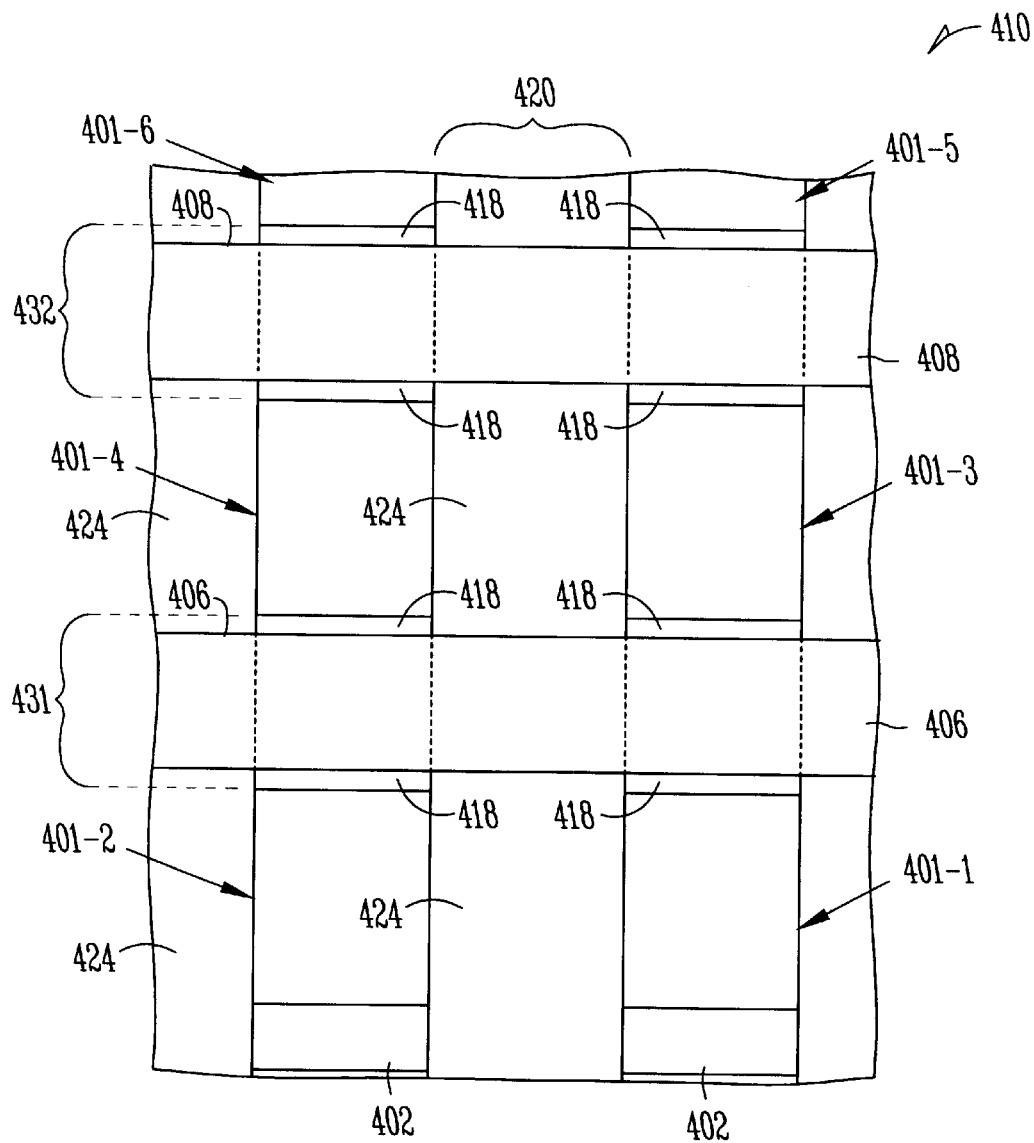
FIG. 4B is a top view of FIG. 4A illustrating generally pillars including the ultra thin single crystalline vertical transistors.

FIG. 4B is a top view of FIG. 4A illustrating generally pillars 401-1, 401-2, 401-3, 401-4, 401-5, and 401-6 including the ultra thin single crystalline vertical transistors 430. FIG. 4B illustrates subsequently formed insulator such as oxide 424, formed in trenches 420 to provide isolation between the columns of pillars including the ultra thin single crystalline vertical transistors 430. In this embodiment, first word line 406 is in a trench 431 between column adjacent pillars having the ultra thin single crystalline vertical transistors 430, such as between pillars 401-1 and 401-3 which are coupled to the same bit line. As shown in FIG. 4A, no ultra thin single crystalline vertical transistor 430 has been formed on the side of pillar 401-3 which adjoins trench 431.

Thus in FIG. 4B, wordline 406 is only a passing wordline along a side of pillar 401-3 in trench 431. However, as shown in FIG. 4A, an ultra thin single crystalline vertical transistor 430 has been formed on the side of pillar 401-1 which adjoins trench 431. Thus, as shown in FIG. 4B, wordline 406 is serves as a gate separated by gate oxide 418 for the ultra thin single crystalline vertical transistor 430 along the side of pillar 401-1 which adjoins trench 431.

Similarly, as shown in FIG. 4A, no ultra thin single crystalline vertical transistor 430 has been formed on the side of pillar 401-2 which adjoins trench 431. Thus, in FIG. 4B, wordline 406 is only a passing wordline along a side of pillar 401-2 in trench 431. However, as shown in FIG. 4A, an ultra thin single crystalline vertical transistor 430 has been formed on the side of pillar 401-2 which adjoins trench 431. Thus, as shown in FIG. 4B, wordline 406 is serves as a gate separated by gate oxide 418 for the ultra thin single crystalline vertical transistor 430 along the side of pillar 401-4 which adjoins trench 431. Thus, in the folded bit line DRAM embodiment of FIG. 4B, first word line 406 is shared between alternating, row adjacent pillars including the ultra thin single crystalline vertical transistors 430, which are coupled to different bit lines 402. First word line 406 is located in trench 431 that extends between the pillars 401-1 and 401-3. As shown in FIG. 4B, first word line 406 is separated by a thin oxide 418 from the vertically oriented pillars 401-1, 401-2, 401-3, and 401-4 which are adjacent trench 431. Thus, thin oxide 418 serves as a thin gate oxide for those pillars which have the ultra thin single crystalline vertical transistors 430 on a side adjoining trench 431, e.g. pillars 401-1 and 401-4.

Analogously, in the embodiment of FIG. 4B, second word line 408 is in a trench 432 between column adjacent pillars having the ultra thin single crystalline vertical transistors 430, such as between pillars 401-3 and 401-5 which are coupled to the same bit line. As shown in FIG. 4A, no ultra thin single crystalline vertical transistor 430 has been formed on the side of pillar 401-5 which adjoins trench 432. Thus in FIG. 4B, wordline 408 is only a passing wordline along a side of pillar 401-5 in trench 431. However, as shown in FIG. 4A, an ultra thin single crystalline vertical transistor 430 has been formed on the side of pillar 401-3 which adjoins trench 432. Thus, as shown in FIG. 4B, wordline 408 is serves as a gate separated by gate oxide 418 for the ultra thin single crystalline vertical transistor 430 along the side of pillar 401-3 which adjoins trench 431.

Similarly, as shown in FIG. 4A, no ultra thin single crystalline vertical transistor 430 has been formed on the side of pillar 401-6 which adjoins trench 432. Thus, in FIG. 4B, wordline 408 is only a passing wordline along a side of pillar 401-4 in trench 432. However, as shown in FIG. 4A, an ultra thin single crystalline vertical transistor 430 has been formed on the side of pillar 401-4 which adjoins trench 432. Thus, as shown in FIG. 4B, wordline 408 is serves as a gate separated by gate oxide 418 for the ultra thin single crystalline vertical transistor 430 along the side of pillar 401-4 which adjoins trench 432. Thus, in the folded bit line DRAM embodiment of FIG. 4B, second word line 408 is shared between alternating, row adjacent pillars including the ultra thin single crystalline vertical transistors 430, which are coupled to different bit lines 402. Second word line 408 is located in trench 432 that extends between the pillars 401-3 and 401-5. As shown in FIG. 4B, second word line 408 is separated by a thin oxide 418 from the vertically oriented pillars 401-3, 401-4, 401-5, and 401-6 which are adjacent trench 432. Thus, thin oxide 418 serves as a thin gate oxide for those pillars which have the ultra thin single crystalline vertical transistors 430 on a side adjoining trench 432, e.g. pillars 401-3 and 401-6.

Figure 4C:
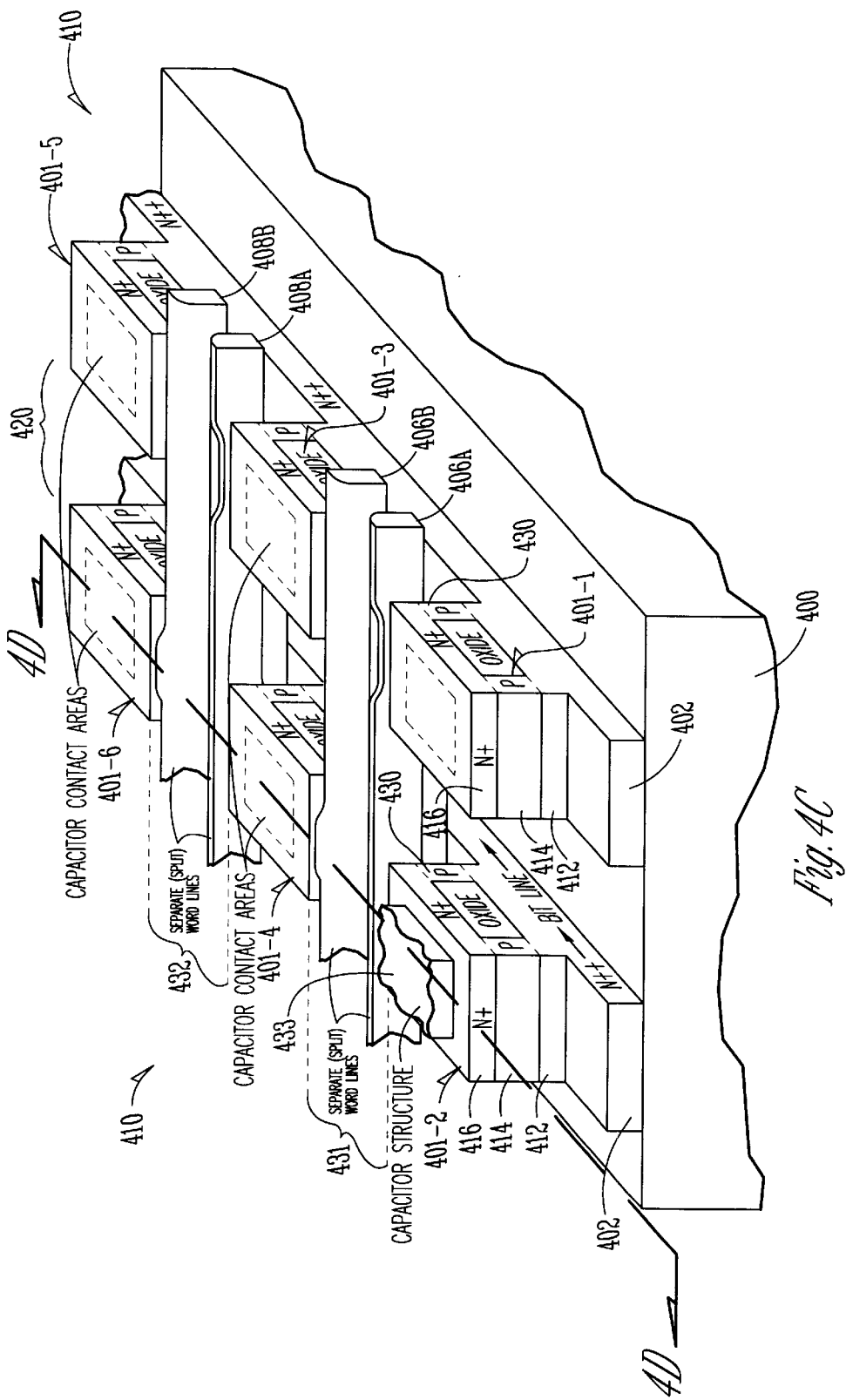
FIG. 4C is a perspective view illustrating another embodiment of a portion of a folded bit line memory array according to the present invention.

FIG. 4C is a perspective view illustrating another embodiment of a portion of a folded bit line memory array 410 according to the present invention. FIG. 4C illustrates portions of six memory cells 401-1, 401-2, 401-3, 401-4, 401-5, and 401-6 which include ultra thin single crystalline vertical transistors 430. According to the teachings of the present invention, these ultra thin single crystalline vertical transistors 430 are formed, as described in connection with FIG. 3, along side of pillars extendingly outwardly from a semiconductor substrate 400. These pillars are formed on conductive segments of bit lines 402 which represent particular ones of bit lines BL0–BLn. In the embodiment shown in FIG. 4C, conductive segments of first word line 406A and 406B represent any one of word lines WL0–WLm, which provide integrally formed first gates for ultra thin single crystalline vertical transistors 430 formed along alternating, row adjacent pillars on opposing sides of a trench in which the particular first word lines 406A and 406B are interposed. Conductive segments of second word line 408A and 408B represent any one of word lines R0–Rm, which provide integrally formed second gates for ultra thin single crystalline vertical transistors 430 formed along alternating, row adjacent pillars on opposing sides of a trench in which the particular second word lines 408A and 408B are interposed. Thus, word lines WL0–WLm and R0–RM are alternatingly disposed (interdigitated) within the array 410.

As explained in connection with FIG. 3, ultra thin single crystalline vertical transistors 430 are formed alongside of pillars that extend outwardly from an underlying substrate 410. As described below, substrate 400 includes bulk semiconductor starting material, semiconductor-on-insulator (SOI) starting material, or SOI material that is formed from a bulk semiconductor starting material during processing.

FIG. 4C illustrates one example embodiment, using bulk silicon processing techniques. As shown in FIG. 4C, the pillars include an n+ silicon layer formed on a bulk silicon substrate 400 to produce first contact layer 412 and integrally formed n++ conductively doped bit lines 402 defining a particular column of memory cells shown as BL0–Bln in FIGS. 2A and 2B. An oxide layer 414 is formed on n+ first contact layer 412. A further n+ silicon layer is formed on oxide layer 414 to produce second contact layer 416 of in the pillars. Storage capacitors 432 are formed on the second contact layers 416 using any suitable technique as the same will be known and understood by one of ordinary skill in the art upon reading this disclosure.

Word lines WL0–WLm and R0–RM are alternatingly disposed (interdigitated) within the array 410. For example, first word lines 406A and 406B are interposed in a trench 431 between pillars of 401-1 and 401-3 and between pillars 401-2 and 401-4 and separated by an insulator material such as an oxide. Second word lines 408A and 408B are interposed in a trench 432 between semiconductor pillars of memory cell pairs 401-3 and 401-5 and between pillars. In the embodiment shown in FIG. 4C, the ultra thin single crystalline vertical transistors 430 are formed along side of the pillars adjacent to the trenches 431 and 432 in alternating, row adjacent pillars. Accordingly, the folded bit line device is provided with word lines 406A, 406B and 408A, 408B serving as or addressing gates for transistors 430 in alternating pillars along a row. As shown in FIG. 4C, the ultra thin single crystalline vertical transistors 430 which are formed along side of the pillars are also in contact with bit lines 402 through the first contact layers 412. In this embodiment, bit lines 402 contact bulk semiconductor substrate 400.

Isolation trenches provide isolation between ultra thin single crystalline vertical transistors 430 of adjacent memory cells 401-1, 401-2, 401-3, 401-4, 401-5, and 401-6. Columns of pillars along a bit line direction are separated by a trench 420 that is subsequently filled with a suitable insulating material such as silicon dioxide. For example, a trench 420 provides isolation between pillars 401-1 and 401-2 and between pillars 401-3 and 401-4. Rows of pillars including the ultra thin single crystalline vertical transistors 430 are alternatingly separated by trenches 431 and 432, each of which contain word lines WL0–WLm and R0–Rm as described above. Such word lines WL0–WLm and R0–Rm are separated from substrate 400 by an underlying insulating layer, described below, and separated from the ultra thin vertically oriented single crystalline body regions of ultra thin single crystalline vertical transistors 430 (as described in connection with FIG. 3) by a gate oxide, also described below. Trenches 431 and 432 extend substantially orthogonally to bit lines 402.

In one embodiment, respective first and second word lines, 406A, 406B and 408A, 408B respectively, are formed of a refractory metal, such as tungsten or titanium. In another embodiment, first and second word lines, 406A, 406B and 408A, 408B respectively, can be formed of n+ doped polysilicon. Similarly, other suitable conductors could also be used for first and second word lines, 406A, 406B and 408A, 408B respectively. One of ordinary skill in the art will further understand upon reading this disclosure that the conductivity types described herein can be reversed by altering doping types such that the present invention is equally applicable to include structures having ultra thin vertically oriented single crystalline p-channel type transistors 430. The invention is not so limited.

Burying first and second word lines, 406A, 406B and 408A, 408B respectively, below semiconductor a top surface of the vertical pillars provides additional space on the upper portion of memory cells, 401-1, 401-2, 401-3, 401-4, 401-5, and 401-6, for formation of storage capacitors 433. Increasing the area available for forming storage capacitor 433 increases the possible obtainable capacitance value of storage capacitor 433. In one embodiment, storage capacitor 433 is a stacked capacitor that is formed using any of the many capacitor structures and process sequences known in the art. Other techniques could also be used for implementing storage capacitor 433. Contacts to the first and second word lines, 406A, 406B and 408A, 408B respectively, can be made outside of the memory array 410.

Figure 4D:
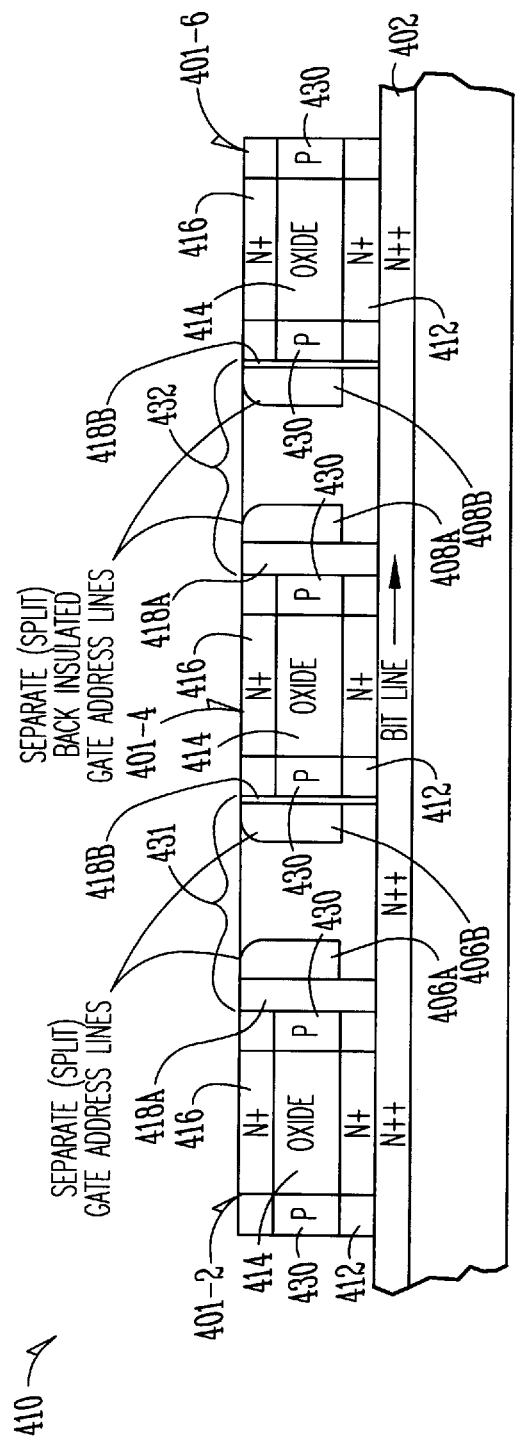
FIG. 4D is a cross sectional view taken along cut-line 4D—4D of FIG. 4C illustrating generally pillars including the ultra thin single crystalline vertical transistors according to the teachings of the present invention.

FIG. 4D is a cross sectional view taken along cut-line 4D—4D of FIG. 4C illustrating generally pillars including the ultra thin single crystalline vertical transistors 430. As shown in FIG. 4D, first word lines 406A and 406B are formed on opposing sides of trench 431 adjacent pillars including the ultra thin single crystalline vertical transistors 430, such as between pillars 401-2 and 401-4 which are coupled to the same bit line in a given column. In the embodiment of FIG. 4C, the ultra thin single crystalline vertical transistors 430 have been formed as pairs on opposing sides of the pillars 401-1, 401-2, 401-3, 401-4, 401-5, and 401-6. Accordingly, in the folded bit line DRAM device of the present invention, wordline 406A is separated by a thick oxide 418A from the ultra thin single crystalline vertical transistor 430 formed along side of pillar 401-2 adjoining trench 431 such that wordline 406A only serves as a passing wordline for this ultra thin single crystalline vertical transistor 430. Conversely, wordline 406B is separated by a thin gate oxide 418B from the ultra thin single crystalline vertical transistor 430 formed along side of pillar 401-4 adjoining trench 431 such that wordline 406B serves as an integrally formed gate for this ultra thin single crystalline vertical transistor 430. Similarly, wordline 408A is separated by a thick oxide 418A from the ultra thin single crystalline vertical transistor 430 formed along side of pillar 401-4 adjoining trench 432 such that wordline 408A only serves as a passing wordline for this ultra thin single crystalline vertical transistor 430. And, wordline 408B is separated by a thin gate oxide 418B from the ultra thin single crystalline vertical transistor 430 formed along side of pillar 401-6 adjoining trench 432 such that wordline 408B serves as an integrally formed gate for this ultra thin single crystalline vertical transistor 430.

Figure 5A:
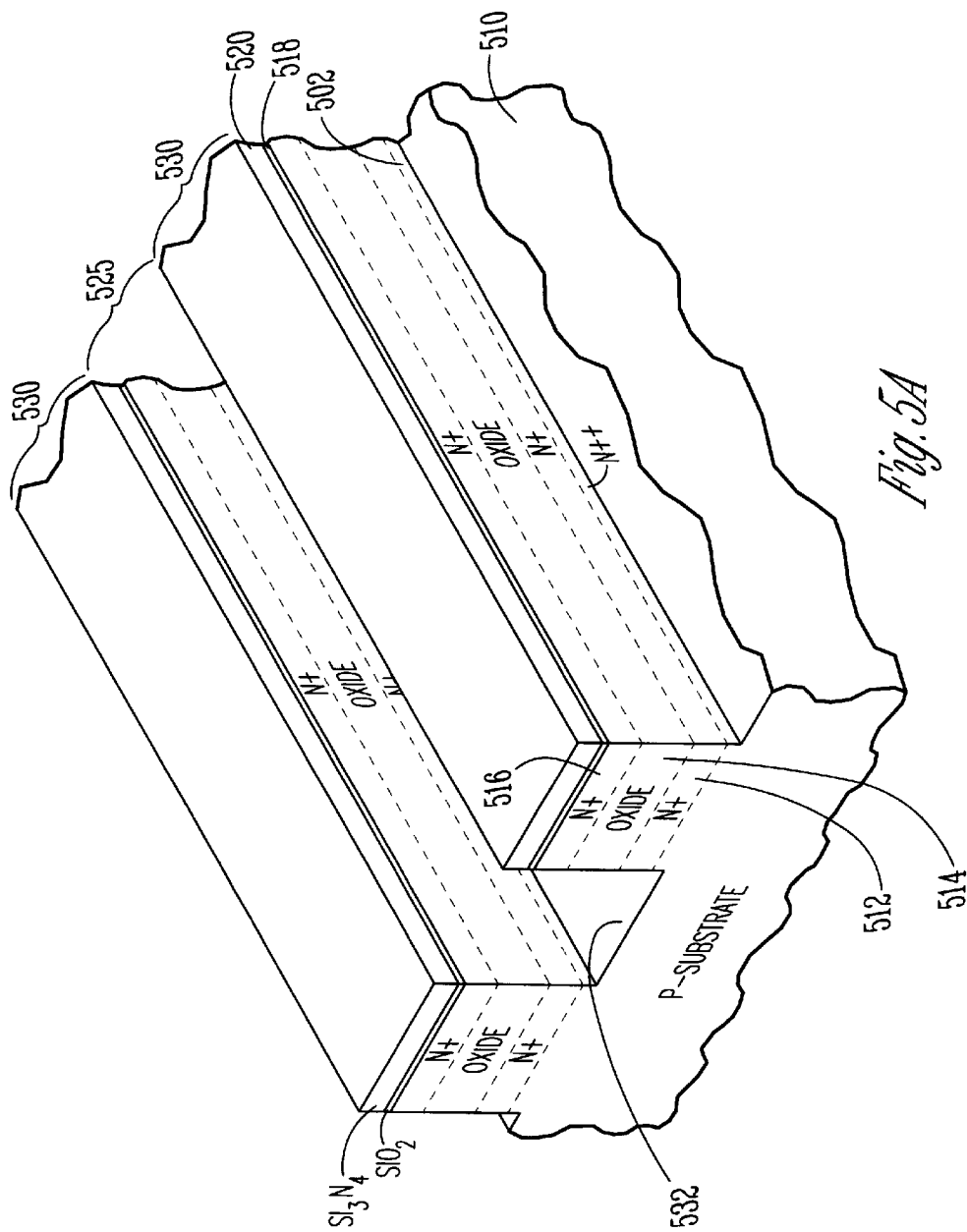
FIGS. 5A–5C illustrate an initial process sequence which for forming pillars along side of which vertical ultra thin body transistors can later be formed as part of forming a folded bit line DRAM according to the teachings of the present invention.
Figure 5B:
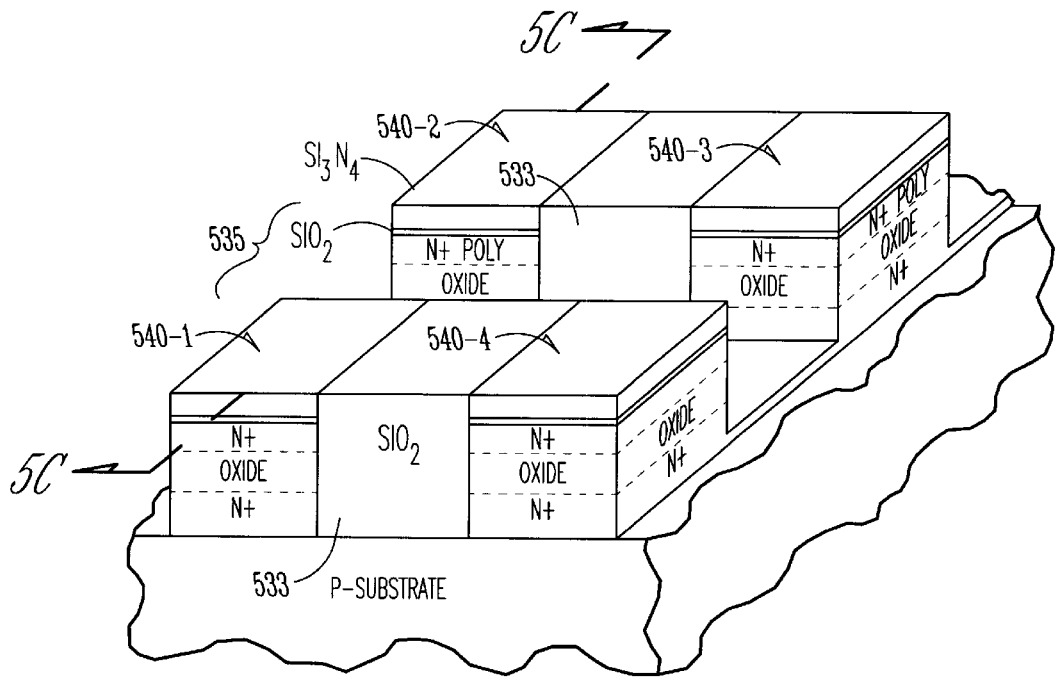
Figure 5C:
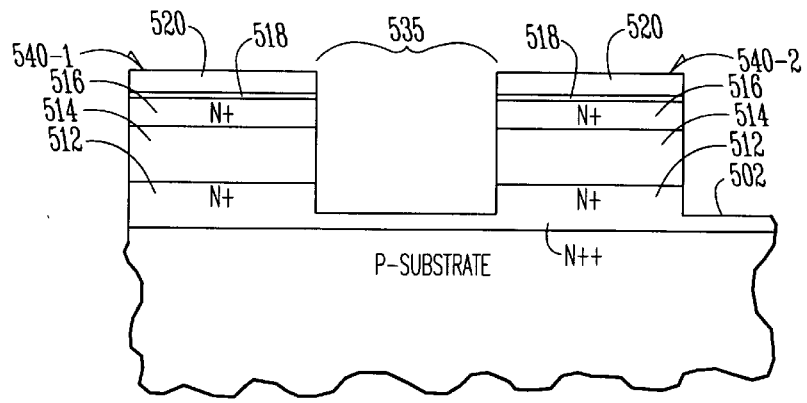

FIGS. 5A–5C illustrate an initial process sequence for forming pillars along side of which vertical ultra thin body transistors can later be formed as part of forming a folded bit line DRAM according to the teachings of the present invention. The dimensions suggested are appropriate to a 0.1 µm cell dimension (CD) technology and may be scaled accordingly for other CD sizes. In the embodiment of FIG. 5A, a p-type bulk silicon substrate 510 starting material is used. An n++ and n+ silicon composite first contact layer 512 is formed on substrate 510, such as by ion-implantation, epitaxial growth, or a combination of such techniques to form a single crystalline first contact layer 512. According to the teachings of the present invention, the more heavily conductively doped lower portion of the first contact layer 512 also functions as the bit line 502. The thickness of the n++ portion of first contact layer 512 is that of the desired bit line 502 thickness, which can be approximately between 0.1 to 0.25 µm. The overall thickness of the first contact layer 512 can be approximately between 0.2 to 0.5 µm. An oxide layer 514 of approximately 100 nanometers (nm), 0.1 µm, thickness or less is formed on the first contact layer 512. In one embodiment, the oxide layer 514 can be formed by thermal oxide growth techniques. A second contact layer 516 of n+ silicon is formed on the oxide layer 514. The second contact layer 516 is formed to a thickness of 100 nm or less.

Next, a thin silicon dioxide layer ($SiO_2$) 518 of approximately 10 nm is deposited on the second contact layer 516. A thicker silicon nitride layer ($Si_3N_4$) 520 of approximately 20 to 50 nm in thickness is deposited on the thin silicon dioxide layer ($SiO_2$) 518 to form pad layers, e.g. layers 518 and 520. These pad layers 518 and 520 can be deposited using any suitable technique such as by chemical vapor deposition (CVD).

A photoresist is applied and selectively exposed to provide a mask for the directional etching of trenches 525, such as by reactive ion etching (RIE). The directional etching results in a plurality of column bars 530 containing the stack of nitride layer 520, pad oxide layer 518, second contact layer 516, oxide layer 514, and first contact layer 512. Trenches 525 are etched to a depth that is sufficient to reach the surface 532 of substrate 510, thereby providing separation between conductively doped bit lines 502. The photoresist is removed. Bars 530 are now oriented in the direction of bit lines 502, e.g. column direction. In one embodiment, bars 530 have a surface line width of approximately 0.1 micron or less. The width of each trench 525 can be approximately equal to the line width of bars 530. The structure is now as appears in FIG. 5A.

In FIG. 5B, isolation material 533, such as $SiO_2$ is deposited to fill the trenches 525. The working surface is then planarized, such as by chemical mechanical polishing/planarization (CMP). A second photoresist is applied and selectively exposed to provide a mask for the directional etching of trenches 535 orthogonal to the bit line 502 direction, e.g. row direction. Trenches 535 can be formed using any suitable technique such as by reactive ion etching (RIE). Trenches 535 are etched through the exposed SiO$_2$ and the exposed stack of nitride layer 520, pad oxide layer 518, second contact layer 516, oxide layer 514, and into the first contact layer 512 but only to a depth sufficient to leave the desired bit line 502 thickness, e.g. a remaining bit line thickness of typically less than 100 nm. The structure is now as appears in FIGS. 5B having individually defined pillars 540-1, 540-2, 540-3, and 540-4.

FIG. 5C illustrates a cross sectional view of the structure shown in FIG. 5B taken along cut-line 5C—5C. FIG. 5C shows the continuous bit line 502 connecting adjacent pillars 540-1 and 540-2 in any given column. Trench 535 remains for the subsequent formation of wordlines, as described below, in between adjacent rows of the pillars, such as a row formed by pillars 540-1 and 540-4 and a row formed by pillars 540-2, and 540-3.

Figure 6A:
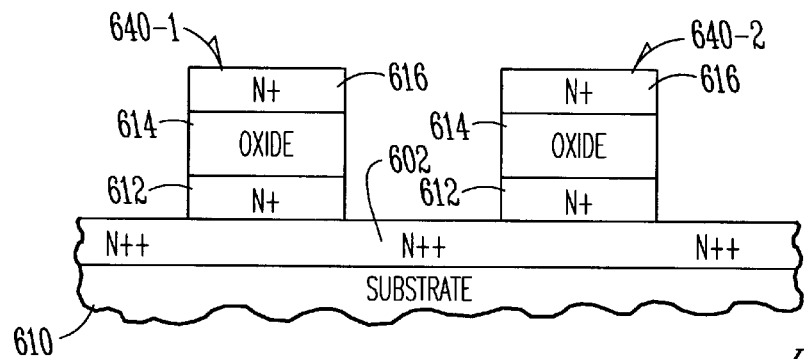
FIGS. 6A–6C illustrate that the above techniques described in connection with FIGS. 5A–5C can be implemented with a bulk CMOS technology or a silicon on insulator (SOI) technology.
Figure 6B:
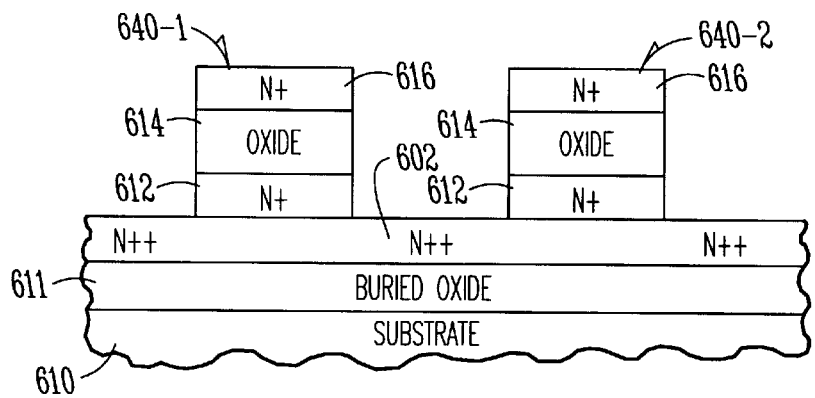
Figure 6C:
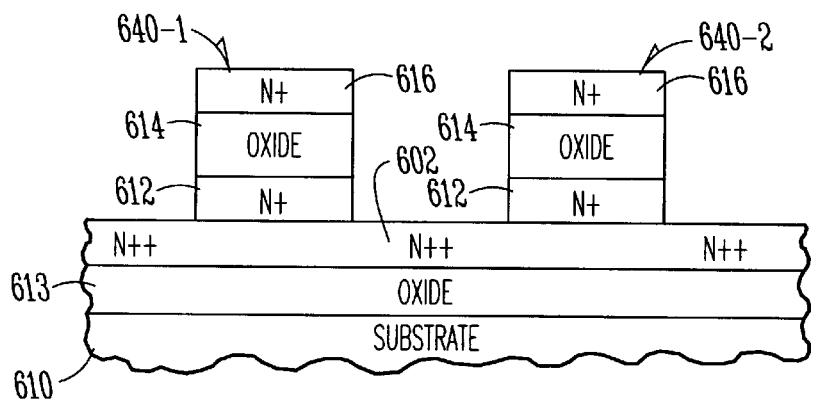

FIG. 6A–6C illustrate that the above techniques described in connection with FIGS. 5A–5C can be implemented on a bulk CMOS technology substrate or a silicon on insulator (SOI) technology substrate. FIG. 6A represents the completed sequence of process steps shown in FIGS. 5A–5C, minus the pad layers, formed on a lightly doped p-type bulk silicon substrate 610. The structure shown in FIG. 6A is similar to the cross sectional view in FIG. 5C and shows a continuous bit line 602 with pillar stacks 640-1 and 640-2 formed thereon. The pillars 640-1 and 640-2 include an n+ first contact layer 612, an oxide layer 614 formed thereon, and a second n+ contact layer 616 formed on the oxide layer 614.

FIG. 6B represents the completed sequence of process steps shown in FIGS. 5A–5C, minus the pad layers, formed on a commercial SOI wafer, such as SIMOX. As shown in FIG. 6B, a buried oxide layer 611 is present on the surface of the substrate 610. The structure shown in FIG. 6B is also similar to the cross sectional view in FIG. 5C and shows a continuous bit line 602 with pillar stacks 640-1 and 640-2 formed thereon, only here the continous bit line 602 is separated from the substrate 610 by the buried oxide layer 611. Again, the pillars 640-1 and 640-2 include an n+ first contact layer 612, an oxide layer 614 formed thereon, and a second n+ contact layer 616 formed on the oxide layer 614.

FIG. 6C represents the completed sequence of process steps shown in FIGS. 5A–5C, minus the pad layers, forming islands of silicon on an insulator, where the insulator 613 has been formed by oxide under cuts. Such a process includes the process described in more detail in U.S. Pat. No. 5,691,230, by Leonard Forbes, entitled "Technique for Producing Small Islands of Silicon on Insulator," issued Nov. 25, 1997, which is incorporated herein by reference. The structure shown in FIG. 6C is also similar to the cross sectional view in FIG. 5C and shows a continuous bit line 602 with pillar stacks 640-1 and 640-2 formed thereon, only here the continous bit line 602 is separated from the substrate 610 by the insulator 613 which has been formed by oxide under cuts such as according to the process referenced above. Again, the pillars 640-1 and 640-2 include an n+ first contact layer 612, an oxide layer 614 formed thereon, and a second n+ contact layer 616 formed on the oxide layer 614. Thus, according to the teachings of the present invention, the sequence of process steps to form pillars, as shown in FIGS. 5A–5C, can include forming the same on at least three different types of substrates as shown in FIGS. 6A–6C.

Figure 7A:
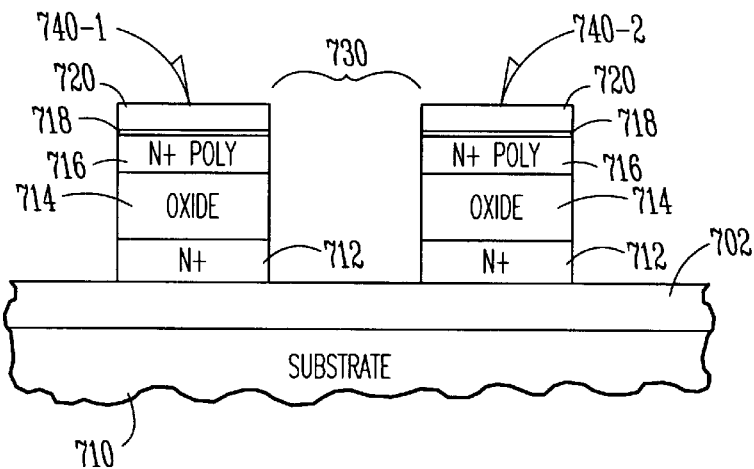
FIGS. 7A–7D illustrate a process sequence continuing from the pillar formation embodiments provided in FIGS. 5A–6C to form vertical ultra thin body transistors along side of the pillars.
Figure 7B:
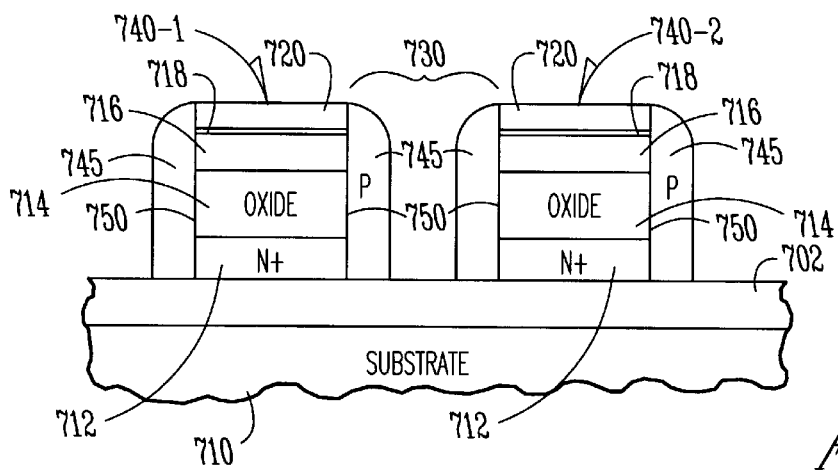
Figure 7C:
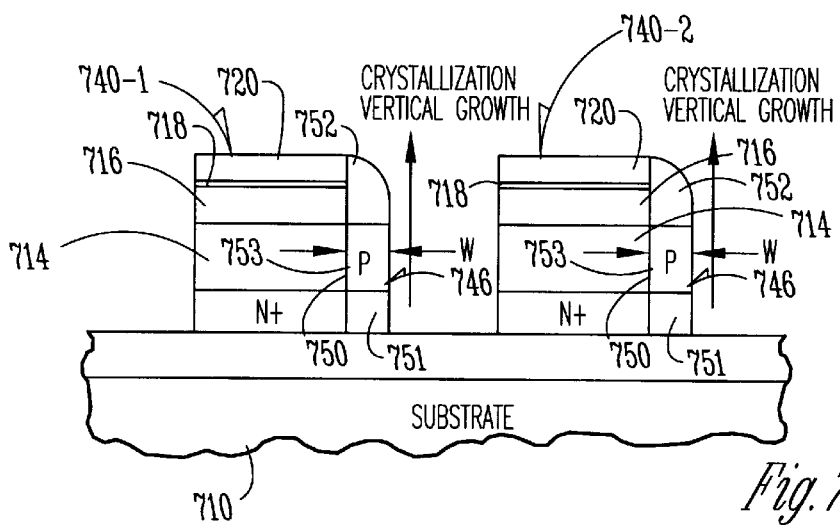

FIGS. 7A–7C illustrate a process sequence continuing from the pillar formation embodiments provided in FIGS. 5A–5C, and any of the substrates shown in FIGS. 6A–6C, to form vertical ultra thin body transistors along side of the pillars, such as pillars 540-1 and 540-2 in FIG. 5C. For purposes of illustration only, FIG. 7A illustrates an embodiment pillars 740-1 and 740-2 formed on a p-type substrate 710 and separated by a trench 730. Analogous to the description provided in connection FIG. 5A–5C, FIG. 7A shows a first single crystalline n+ contact layer 712 a portion of which, in one embodiment, is integrally formed with an n++ bit line 702. An oxide layer region 714 is formed in pillars 740-1 and 740-2 on the first contact layer 712. A second n+ contact layer 716 is shown formed on the oxide layer region 714 in the pillars 740-1 and 740-2. And, pad layers of (SiO$_2$) 718 and (Si$_3$N$_4$) 720, respectively are shown formed on the second contact layer 716 in the pillars 740-1 and 740-2.

In FIG. 7B, a lightly doped p-type polysilicon layer 745 is deposited over the pillars 740-1 and 740-2 and directionally etched to leave the lightly doped p-type material 745 on the sidewalls 750 of the pillars 740-1 and 740-2. In one embodiment according to the teachings of the present invention, the lightly doped p-type polysilicon layer is directionally etched to leave the lightly doped p-type material 745 on the sidewalls 750 of the pillars 740-1 and 740-2 having a width (W), or horizontal thickness of 10 nm or less. The structure is now as shown in FIG. 7B.

The next sequence of process steps is described in connection with FIG. 7C. At this point another masking step, as the same has been described above, can be employed to isotropically etch the polysilicon 745 off of some of the sidewalls 750 and leave polysilicon 745 only on one sidewall of the pillars 740-1 and 740-2 if this is required by some particular configuration, e.g. forming ultra thin body transistors only on one side of pillars 740-1 and 740-2.

In FIG. 7C, the embodiment for forming the ultra thin single crystalline vertical transistors, or ultra thin body transistors, only on one side of pillars 740-1 and 740-2 is shown. In FIG. 7C, the wafer is heated at approximately 550 to 700 degrees Celsius. In this step, the polysilicon 745 will recrystallize and lateral epitaxial solid phase regrowth will occur vertically. As shown in FIG. 7C, the single crystalline silicon at the bottom of the pillars 740-1 and 740-2 will seed this crystal growth and an ultrathin single crystalline film 746 will form which can be used as the channel of an ultra thin single crystalline vertical MOSFET transistor. In the embodiment of FIG. 7C, where the film is left only on one side of the pillar, the crystallization will proceed vertically and into the n+ polysilicon second contact material/layer 716 on top of the pillars 740-1 and 740-2. If however, both sides of the pillars 740-1 and 740-2 are covered, the crystallization will leave a grain boundary near the center on top of the pillars 740-1 and 740-2. This embodiment is shown in FIG. 7D.

Figure 7D:
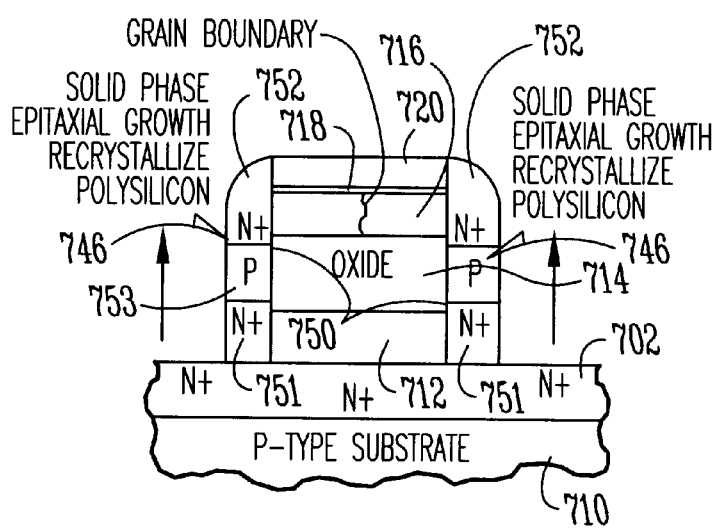

As shown in FIGS. 7C and 7D, drain and source regions, 751 and 752 respectively, will be formed in the ultrathin single crystalline film 746 along the sidewalls 750 of the pillars 740-1 and 740-2 in the annealing process by an out diffusion of the n+ doping from the first and the second contact layers, 712 and 716. In the annealing process, these portions of the ultrathin single crystalline film 746, now with the n+ dopant, will similarly recrystallize into single crystalline structure as the lateral epitaxial solid phase regrowth occurs vertically. The drain and source regions, 751 and 752, will be separated by a vertical single crystalline body region 752 formed of the p-type material. In one embodiment of the present invention, the vertical single crystalline body region will have a vertical length of less than 100 nm. The structure is now as shown in FIGS. 7C or 7D. As one of ordinary skill in the art will understand upon reading this disclosure. A conventional gate insulator can be grown or deposited on this ultrathin single crystalline film 746. And, either horizontal or vertical gate structures can be formed in trenches 730.

As one of ordinary skill in the art will understand upon reading this disclosure, drain and source regions, 751 and 752 respectively, have been formed in an ultrathin single crystalline film 746 to form a portion of the ultra thin single crystalline vertical transistors, or ultra thin body transistors, according to the teachings of the present invention. The ultrathin single crystalline film 746 now includes an ultra thin single crystalline vertical first source/drain region 751 coupled to the first contact layer 712 and an ultra thin single crystalline vertical second source/drain region 752 coupled to the second contact layer 716. An ultra thin p-type single crystalline vertical body region 753 remains along side of, or opposite, the oxide layer 714 and couples the first source/drain region 751 to the second source/drain region 752. In effect, the ultra thin p-type single crystalline vertical body region 753 separates the drain and source regions, 751 and 752 respectively, and can electrically couple the drain and source regions, 751 and 752, when a channel is formed therein by an applied potential. The drain and source regions, 751 and 752 respectively, and the ultra thin body region 753 are formed of single crystalline material by the lateral solid phase epitaxial regrowth which occurs in the annealing step.

The dimensions of the structure now include an ultra thin single crystalline body region 753 having a vertical length of less than 100 nm in which a channel having a vertical length of less than 100 nm can be formed. Also, the dimensions include drain and source regions, 751 and 752 respectively, having a junction depth defined by the horizontal thickness of the ultrathin single crystalline film 746, e.g. less than 10 nm. Thus, the invention has provided junction depths which are much less than the channel length of the device and which are scalable as design rules further shrink. Further, the invention has provided a structure for transistors with ultra thin bodies so that a surface space charge region in the body of the transistor scales down as other transistor dimensions scale down. In effect, the surface space charge region has been minimized by physically making the body region of the MOSFET ultra thin, e.g. 10 nm or less.

One of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited. From the process descriptions described above, the fabrication process can continue to form a number of different horizontal and vertical gate structure embodiments in the trenches 730 as described in connection with the Figures below.

Figure 8A:
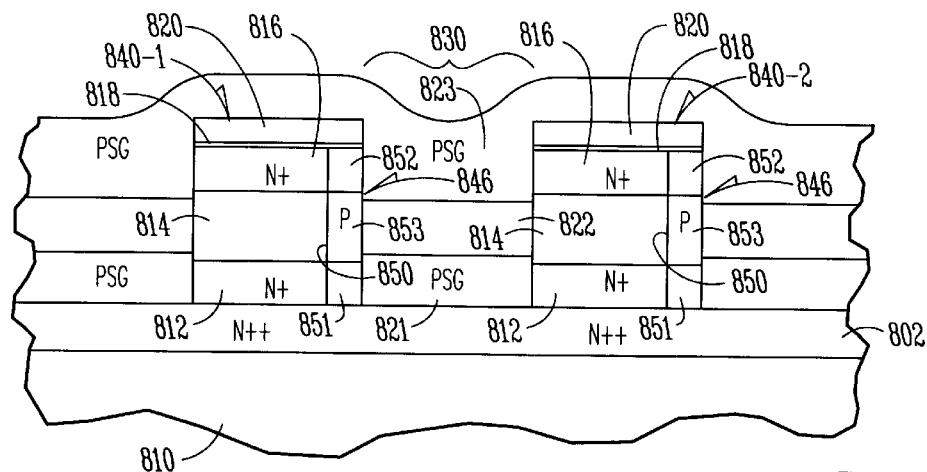
FIGS. 8A–8C illustrate a process sequence for forming a horizontal gate structure embodiment, referred to herein as horizontal replacement gates, in connection with the present invention.
Figure 8B:
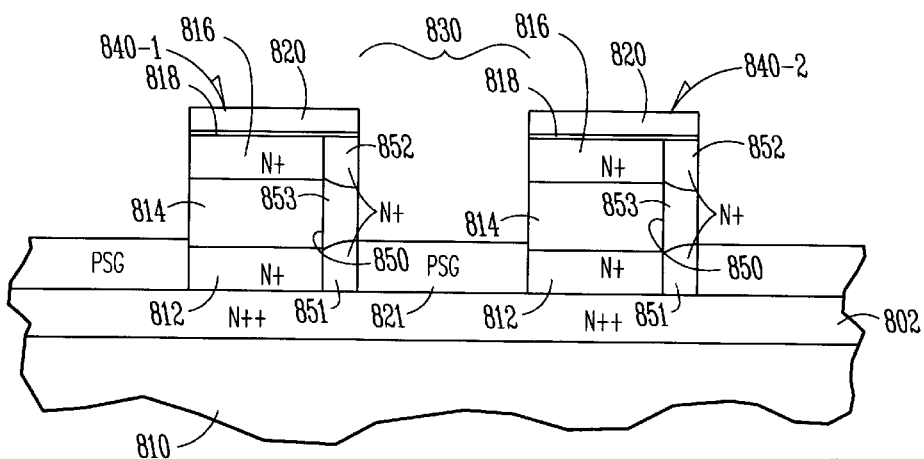
Figure 8C:
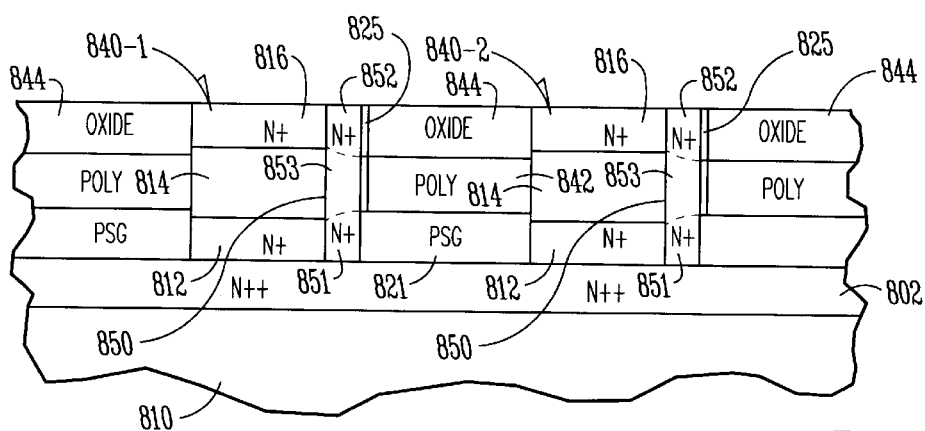

FIGS. 8A–8C illustrate a process sequence for forming a horizontal gate structure embodiment, referred to herein as horizontal replacement gates, in connection with the present invention. The dimensions suggested in the following process steps are appropriate to a 0.1 micrometer CD technology and may be scaled accordingly for other CD sizes. FIG. 8A represents a structure similar to that shown in FIG. 7C. That is FIG. 8A shows an ultrathin single crystalline film 846 along the sidewalls 850 of pillars 840-1 and 840-2 in trenches 830. The ultrathin single crystalline film 846 at this point includes an ultra thin single crystalline vertical first source/drain region 851 coupled to a first contact layer 812 and an ultra thin single crystalline vertical second source/drain region 852 coupled to a second contact layer 816. An ultra thin p-type single crystalline vertical body region 853 is present along side of, or opposite, an oxide layer 814 and couples the first source/drain region 851 to the second source/drain region 852. According to the process embodiment shown in FIG. 8A an n+ doped oxide layer 821, or PSG layer as the same will be known and understood by one of ordinary skill in the art will understand, is deposited over the pillars 840-1 and 840-2 such as by a CVD technique. This n+ doped oxide layer 821 is then planarized to remove off of the top surface of the pillars 840-1 and 840-2. An etch process is performed to leave about 50 nm at the bottom of trench 830. Next, an undoped polysilicon layer 822 or undoped oxide layer 822 is deposited over the pillars 840-1 and 840-2 and CMP planarized to again remove from the top surface of the pillars 840-1 and 840-2. Then, the undoped polysilicon layer 822 is etched, such as by RIE to leave a thickness of 100 nm or less in the trench 830 along side of, or opposite oxide layer 814. Next, another n+ doped oxide layer 823, or PSG layer as the same will be known and understood by one of ordinary skill in the art will understand, is deposited over the pillars 840-1 and 840-2 such as by a CVD process. The structure is now as appears in FIG. 8A.

FIG. 8B illustrates the structure following the next sequence of fabrication steps. In FIG. 8B, a heat treatment is applied to diffuse the n-type dopant out of the PSG layers, e.g. 821 and 823 respectively, into the vertical ultrathin single crystalline film 846 to additionally form the drain and source regions, 851 and 852 respectively. Next, as shown in FIG. 8B, a selective etch is performed, as the same will be known and understood by one of ordinary skill in the art upon reading this disclosure, to remove the top PSG layer 823 and the undoped polysilicon layer 822, or oxide layer 822 in the trench 830. The structure is now as appears in FIG. 8B.

Next, in FIG. 8C, a thin gate oxide 825 is grown as the same will be known and understood by one of ordinary skill in the art, such as by thermal oxidation, for the ultra thin single crystalline vertical transistors, or ultra thin body transistors on the surface of the ultra thin single crystalline vertical body region 853 for those transistors in alternating, row adjacent pillars which will be connected to trench wordlines for completing the folded bit line DRAM device. Next, doped n+ type polysilicon layer 842 can be deposited to form a gate 842 for the ultra thin single crystalline vertical transistors, or ultra thin body transistors. The structure then undergoes a CMP process to remove the doped n+ type polysilicon layer 842 from the top surface of the pillars 840-1 and 840-2 and RIE etched to form the desired thickness of the gate 842 for the ultra thin single crystalline vertical transistors, or ultra thin body transistors. In one embodiment, the doped n+ type polysilicon layer 842 is RIE etched to form an integrally formed, horizontally oriented word line/gate having a vertical side of less than 100 nanometers opposing the ultra thin single crystalline vertical body region 853. Next, an oxide layer 844 is deposited such as by a CVD process and planarized by a CMP process to fill trenches 830. An etch process is performed, as according to the techniques described above to strip the nitride layer 820 from the structure. This can include a phosphoric etch process using phosphoric acid. The structure is now as appears as is shown in FIG. 8C.

As one of ordinary skill in the art will understand upon reading this disclosure, contacts can be formed to the second contact layer 816 on top of the pillars 840-1 and 840-2 to continue with capacitor formation and standard BEOL processes.

Figure 9A:
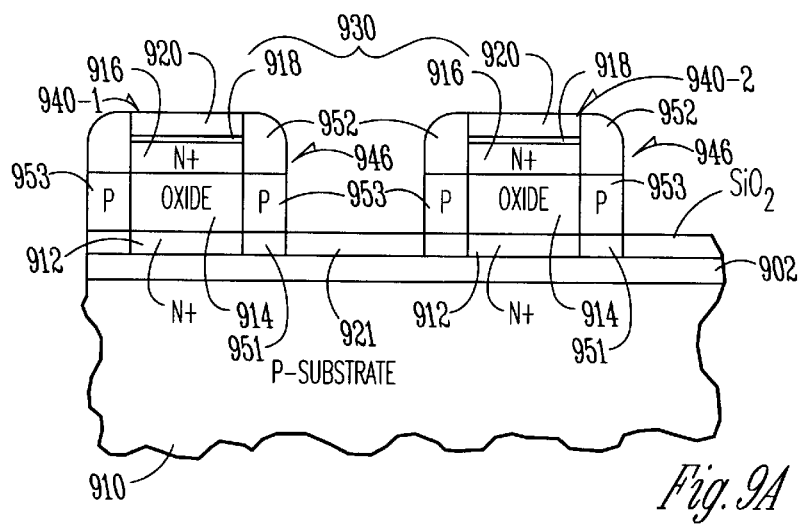
FIGS. 9A–9D illustrate a process sequence for forming a vertical gate structure embodiment, in connection with the present invention.
Figure 9B:
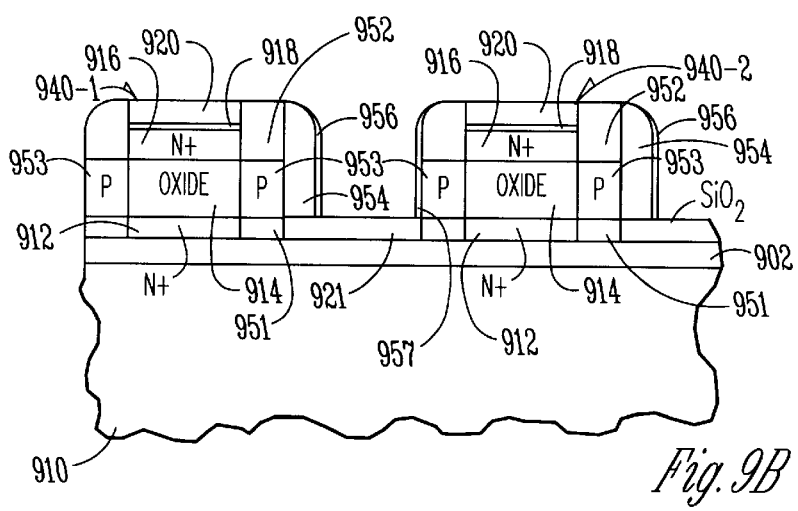
Figure 9C:
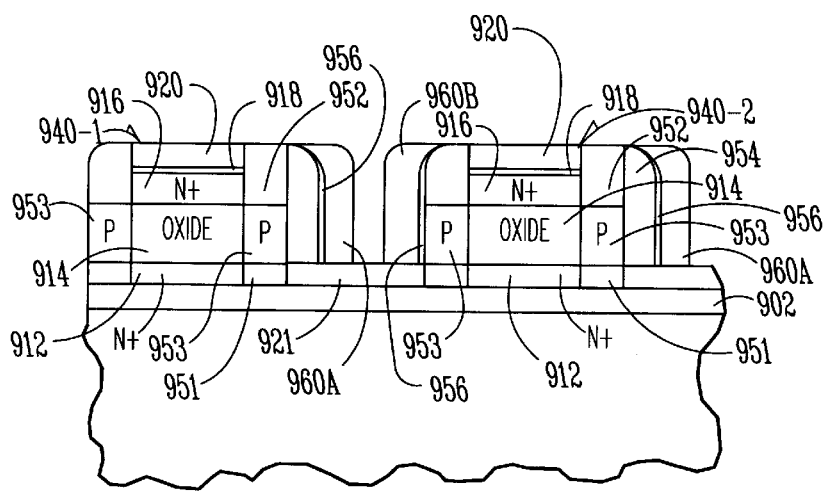

FIGS. 9A–9C illustrate a process sequence for forming a vertical gate structure embodiment according to the teachings of the present invention. The dimensions suggested in the following process steps are appropriate to a 0.1 micrometer CD technology and may be scaled accordingly for other CD sizes. FIG. 9A represents a structure similar to that shown in FIG. 7C. That is FIG. 9A shows an ultrathin single crystalline film 946 along the sidewalls 950 of pillars 940-1 and 940-2 in trenches 930. The ultrathin single crystalline film 946 at this point includes an ultra thin single crystalline vertical first source/drain region 951 coupled to a first contact layer 912 and an ultra thin single crystalline vertical second source/drain region 952 coupled to a second contact layer 916. An ultra thin p-type single crystalline vertical body region 953 is present along side of, or opposite, an oxide layer 914 and couples the first source/drain region 951 to the second source/drain region 952. According to the process embodiment shown in FIG. 9A, a conformal nitride layer of approximately 20 nm is deposited, such as by CVD, and directionally etched to leave only on the sidewalls 950. A oxide layer is then grown, such as by thermal oxidation, to a thickness of approximately 50 nm in order to insulate the exposed bit line bars 902. The conformal nitride layer on the sidewalls 950 prevents oxidation along the ultrathin single crystalline film 946. The nitride layer is then stripped, using conventional stripping processes as the same will be known and understood by one of ordinary skill in the art. The structure is now as appears in FIG. 9A.

As shown in FIG. 9B, an intrinsic polysilicon layer 954 is deposited over the pillars 940-1 and 940-2 and in trenches 930 and then directionally etched to leave the intrinsic polysilicon layer 954 only on the vertical sidewalls of the pillars 940-1 and 940-2. A photoresist is applied and masked to expose pillar sides where device channes are to be formed, e.g. integrally formed wordline/gates on alternating, row adjacent pillars. In these locations, the intrinsic polysilicon layer 954 is selectively etched, as the same will be known and understood by one of ordinary skill in the art, to remove the exposed intrinsic polysilicon layer 954. Next, a thin gate oxide layer 956 is grown on the exposed sidewalls of the ultrathin single crystalline film 946 for the ultra thin single crystalline vertical transistors, or ultra thin body transistors. The structure is now as appears in FIG. 9B.

In FIG. 9C, a wordline conductor of an n+ doped polysilicon material or suitable metal 960 is deposited, such as by CVD, to a thickness of approximately 50 nm or less. This wordline conductor 960 is then directionally etched to leave only on the vertical sidewalls of the pillars, including on the thin gate oxide layers 956 of alternating, row adjacent pillars in order to form separate vertical, integrally formed wordline/gates 960A and 960B. The structure is now as appears in FIG. 9C.

Figure 9D:
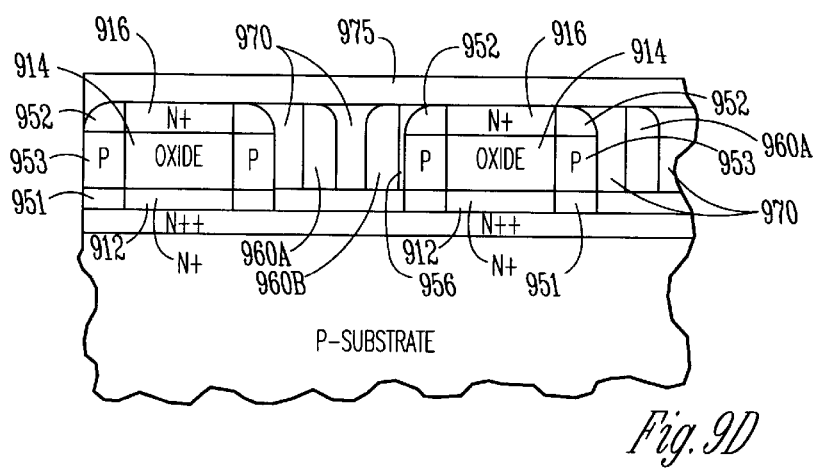

In FIG. 9D, a brief oxide etch is performed to expose the top of the remaining intrinsic polysilicon layer 954. Then, a selective isotropic etch is performed, as the same will be known and understood by one of ordinary skill in the art, in order to remove all of the remaining intrinsic polysilicon layer 954. An oxide layer 970 is deposited, such as by CVD, in order to fill the cavities left by removal of the intrinsic polysilicon layer and the spaces in the trenches 930 between the separate vertical wordlines 960A and 960B neighboring pillars 940-1 and 940-2. As mentioned above, the separate vertical wordlines will integrally form gates on alternating, row adjacent pillars. The oxide layer 970 is planarized by CMP to remove from the top of the pillars 940-1 and 940-2 stopping on the nitride pad 920. Then the remaining pad material 918 and 920 is etched, such as by RIE, to remove from the top of the pillars 940-1 and 940-2. Next, deposit CVD oxide 975 to cover the surface of the pillars 940-1 and 940-2. The structure is now as appears in FIG. 9D.

As one of ordinary skill in the art will understand upon reading this disclosure, the process can now proceed with storage capacitor formation and BEOL process steps.

As one of ordinary skill in the art will understand upon reading this disclosure, the process steps described above produce integrally formed vertically oriented wordlines 960A and 960B which serve as integrally formed vertical gates along the sides of alternating, row adjacent pillars. This produces a folded bit line DRAM structure embodiment which is similar the perspective view of FIG. 4C and the cross sectional view taken along the direction of the bit lines in FIG. 4D.

CONCLUSION

The above structures and fabrication methods have been described, by way of example, and not by way of limitation, with respect to a folded bit line DRAM with ultra thin body transistors. Different types of gate structures are shown which can be utilized on three different types of substrates to form open bit line DRAM memory arrays.

It has been shown that higher and higher density requirements in DRAMs result in smaller and smaller dimensions of the structures and transistors. Conventional planar transistor structures are difficult to scale to the deep sub-micron dimensional regime. The present invention provides vertical access or transfer transistor devices which are fabricated in ultra-thin single crystalline silicon films grown along the sidewall of an oxide pillar. These transistors with ultra-thin body regions scale naturally to smaller and smaller dimensions while preserving the performance advantage of smaller devices. The advantages of smaller dimensions for higher density and higher performance are both achieved in folded bit line memory arrays.

What is claimed is:

1. A folded bit line DRAM device, comprising:
   an array of memory cells formed in rows and columns, wherein each memory cell in the array of memory cells includes:
      a pillar extending outwardly from a semiconductor substrate, wherein the pillar includes a single crystalline first contact layer and a single crystalline second contact layer separated by an oxide layer;
      a single crystalline vertical transistor formed along alternating sides of the pillar within a row of pillars, wherein the single crystalline vertical transistor includes;
         an ultra thin single crystalline vertical first source/drain region coupled to the first contact layer;
         an ultra thin single crystalline vertical second source/drain region coupled to the second contact layer; and
         an ultra thin single crystalline vertical body region which opposes the oxide layer and couples the first and the second source/drain regions;
   a plurality of buried bit lines formed of single crystalline semiconductor material and disposed below the pillars in the array memory cells for interconnecting with the first contact layer of column adjacent pillars in the array of memory cells; and
   a plurality of word lines, each word line disposed orthogonally to the plurality of buried bit lines in a trench between rows of the pillars for addressing alternating body regions of the single crystalline vertical transistors that are adjacent to the trench.

2. The folded bit line DRAM device of claim 1, wherein the ultra thin single crystalline vertical body region includes a channel having a vertical length of less than 100 nanometers.

3. The folded bit line DRAM device of claim 1, wherein the ultra thin single crystalline vertical body region has a horizontal width of less than 10 nanometers.

4. The folded bit line DRAM device of claim 1, wherein the ultra thin single crystalline vertical body region is formed from solid phase epitaxial growth.

5. A folded bit line DRAM device, comprising:
   an array of memory cells, wherein each memory cell in the array of memory cells includes:
      a pillar extending outwardly from a semiconductor substrate, wherein the pillar includes a single crystalline first contact layer and a single crystalline second contact layer separated by an oxide layer;
      a single crystalline vertical transistor formed along side of the pillar, wherein the single crystalline vertical transistor includes;
         an ultra thin single crystalline vertical first source/drain region coupled to the first contact layer;
         an ultra thin single crystalline vertical second source/drain region coupled to the second contact layer;
         an ultra thin single crystalline vertical body region formed along alternating sides of the pillar within a row of pillars and coupling the first and the second source/drain regions; and
         a gate opposing the vertical body region and separated therefrom by a gate oxide;
   a plurality of buried bit lines formed of single crystalline semiconductor material and disposed below the pillars in the array memory cells for interconnecting with the first contact layer of column adjacent pillars in the array of memory cells; and
   a plurality of word lines, each word line disposed orthogonally to the plurality of buried bit lines in a trench between rows of the pillars for addressing gates of the single crystalline vertical transistors that are adjacent to the trench in alternating pillars along a row of pillars.

6. The folded bit line DRAM device of claim 5, wherein the plurality of buried bit lines are more heavily doped than the first contact layer and are formed integrally with the first contact layer.

7. The folded bit line DRAM device of claim 5, wherein the ultra thin single crystalline vertical body region includes a p-type channel having a vertical length of less than 100 nanometers.

8. The folded bit line DRAM device of claim 7, wherein the ultra thin single crystalline vertical body region h as a horizontal width of less than 10 nanometers.

9. The folded bit line DRAM device of claim 5, wherein the pillar extends outwardly from an insulating portion of the semiconductor substrate.

10. The folded bit line DRAM device of claim 5, wherein the semiconductor substrate includes a silicon on insulator substrate.

11. The folded bit line DRAM device of claim 5, wherein the gate includes a horizontally oriented gate, wherein a vertical side of the horizontally oriented gate has a length of less than 100 nanometers.

12. The folded bit line DRAM device of claim 5, wherein the gate includes a vertically oriented gate having a vertical length of less than 100 nanometers.

13. A folded bit line DRAM device, comprising:
   an array of memory cells formed in rows and columns, wherein each memory cell in the array of memory cells includes:
      a pillar extending outwardly from a semiconductor substrate, wherein the pillar includes a single crystalline first contact layer and a single crystalline second contact layer separated by an oxide layer;
      a single crystalline vertical transistor formed along alternating sides of the pillar within a row of pillars, wherein the single crystalline vertical transistor includes;
         an ultra thin single crystalline vertical first source/drain region coupled to the first contact layer;
         an ultra thin single crystalline vertical second source/drain region coupled to the second contact layer;
         an ultra thin single crystalline vertical body region which opposes the oxide layer and couples the first and the second source/drain regions; and
         wherein a surface space charge region for the single crystalline vertical transistor scales down as other dimensions of the transistor scale down;
   a plurality of buried bit lines formed of single crystalline semiconductor material and disposed below the pillars in the array memory cells for interconnecting with the first contact layer of column adjacent pillars in the array of memory cells; and
   a plurality of word lines, each word line disposed orthogonally to the plurality of buried bit lines in a trench between rows of the pillars for addressing alternating body regions of the single crystalline vertical transistors that are adjacent to the trench.

14. A folded bit line DRAM device, comprising:
   an array of memory cells formed in rows and columns, wherein each memory cell in the array of memory cells includes:
      a pillar extending outwardly from a semiconductor substrate, wherein the pillar includes a single crystalline first contact layer and a single crystalline second contact layer separated by an oxide layer;
      a single crystalline vertical transistor formed along alternating sides of the pillar within a row of pillars, wherein the single crystalline vertical transistor includes;
         an ultra thin single crystalline vertical first source/drain region coupled to the first contact layer;
         an ultra thin single crystalline vertical second source/drain region coupled to the second contact layer; and
         an ultra thin single crystalline vertical body region which opposes the oxide layer and couples the first and the second source/drain regions; and
         wherein a horizontal junction depth for the first and the second ultra thin single crystalline vertical source/drain regions is much less than a vertical length of the ultra thin single crystalline vertical body region
   a plurality of buried bit lines formed of single crystalline semiconductor material and disposed below the pillars in the array memory cells for interconnecting with the first contact layer of column adjacent pillars in the array of memory cells; and
   a plurality of word lines, each word line disposed orthogonally to the plurality of buried bit lines in a trench between rows of the pillars for addressing body regions of the single crystalline vertical transistors that are adjacent to the trench.

15. The folded bit line DRAM device of claim 14, wherein the ultra thin single crystalline vertical body region includes a p-type channel having a vertical length of less than 100 nanometers.

16. A semiconductor device, comprising:
an array of pillars formed in rows and columns extending outwardly from a semiconductor substrate, wherein each pillar includes a single crystalline first contact layer and a single crystalline second contact layer separated by an oxide layer;
a pair of single crystalline vertical transistors formed along opposing sides of each pillar, wherein each single crystalline vertical transistor includes;
an ultra thin single crystalline vertical first source/drain region coupled to the first contact layer;
an ultra thin single crystalline vertical second source/drain region coupled to the second contact layer;
an ultra thin single crystalline vertical body region formed along side of the oxide in each pillar and which couples the first and the second source/drain regions formed along side of the pillar
a number of buried bit lines formed of single crystalline semiconductor material and disposed below the single crystalline vertical body regions, wherein the number of buried bit lines couple to the first contact layer along columns of pillars;
a number of wordlines, wherein each wordline is disposed in a trench formed between rows of pillars and below a top surface of the pillars, and wherein each wordline independently addresses body regions for the pair of single crystalline vertical transistors in alternating pillars along a row of pillars; and
a number of capacitors which independently couple to the second contact layer in each pillar.

17. The semiconductor device of claim 16, wherein each wordline integrally forms a gate for addressing the body region in a pillar on a first side of the trench and is isolated from the body region in a column adjacent pillar on a second side of the trench.

18. The semiconductor device of claim 16, wherein each wordline integrally forms a gate for addressing the body region in a pillar on the first side of the trench and is isolated from the body region in a row adjacent pillar on the first side of the trench.

19. The semiconductor device of claim 16, wherein each ultra thin single crystalline vertical body region includes a p-type channel having a vertical length of less than 100 nanometers.

20. The semiconductor device of claim 16, wherein the number of buried bit lines are formed integrally with the first contact layer and are separated from the semiconductor substrate by an oxide layer.

21. The semiconductor device of claim 16, wherein each wordline includes a horizontally oriented wordline having a vertical side length of less than 100 nanometers.

22. The semiconductor device of claim 16, wherein each wordline includes a vertically oriented wordline having a vertical length of less than 100 nanometers.

23. A semiconductor device, comprising:
a folded bit line array of memory cells, wherein each memory cell in the array of memory cells includes:
a pillar extending outwardly from a semiconductor substrate, wherein the pillar includes a single crystalline first contact layer and a single crystalline second contact layer separated by an oxide layer;
a single crystalline vertical transistor formed along alternating sides of the pillar within a row of pillars, wherein the single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region formed along side of the oxide layer and which couples the first and the second source/drain regions; and
a gate opposing the vertical body region and separated therefrom by a gate oxide;
a plurality of buried bit lines formed of single crystalline semiconductor material and disposed below the pillars in the array memory cells for interconnecting with the first contact layer of column adjacent pillars in the array of memory cells; and
a plurality of word lines, each word line disposed orthogonally to the plurality of buried bit lines in a trench between rows of the pillars for addressing gates of the single crystalline vertical transistors that are adjacent to the trench in alternating pillars along a row of pillars.

24. The semiconductor device of claim 23, wherein each single crystalline vertical body region includes a p-type channel having a vertical length of less than 100 nanometers.

25. The semiconductor device of claim 23, wherein each of the plurality of buried bit lines is separated by an oxide layer from the semiconductor substrate.

26. The semiconductor device of claim 23, wherein each gate is integrally formed with one of the plurality of word lines and wherein each of the plurality of word lines includes a horizontally oriented word line having a vertical side of less than 100 nanometers opposing the single crystalline vertical body regions.

27. The semiconductor device of claim 23, wherein each gate is integrally formed with one of the plurality of word lines and wherein each of the plurality of word lines includes a vertically oriented word line having a vertical length of less than 100 nanometers.

28. A memory device, comprising:
an array of memory cells, wherein each memory cell in the array of memory cells includes:
a pillar extending outwardly from a semiconductor substrate, wherein the pillar includes a single crystalline first contact layer and a single crystalline second contact layer separated by an oxide layer;
a single crystalline vertical transistor, wherein the single crystalline vertical transistor includes;
an ultra thin single crystalline vertical first source/drain region coupled to the first contact layer;
an ultra thin single crystalline vertical second source/drain region coupled to the second contact layer;
an ultra thin single crystalline vertical body region formed along alternating sides of the pillar within a row of pillars and coupling the first and the second source/drain regions; and
a gate opposing the vertical body region and separated therefrom by a gate oxide;
a plurality of buried bit lines formed of single crystalline semiconductor material and disposed below the pillars in the array memory cells for interconnecting with the first contact layer of column adjacent pillars in the array of memory cells;
a plurality of first word lines, each first word line disposed orthogonally to the plurality of buried bit lines in a trench between rows of the pillars for addressing gates of the single crystalline vertical transistors that are adjacent to a first side of the trench in alternating pillars along the first side of the trench; and a plurality of second word lines, each second word line disposed orthogonally to the bit lines in the trench between rows of the pillars and separated from each first word line by an insulator such that the second wordline is adjacent a second side of the trench and addresses gates of the single crystalline vertical transistors that are adjacent to a second side of the trench in alternating pillars along a second side of the trench.

29. The memory device of claim 28, wherein each gate is integrally formed with one of the plurality of first word lines in the adjacent trench, and wherein each of the plurality of first word lines includes a vertically oriented word line having a vertical length of less than 100 nanometers.

30. The memory device of claim 28, wherein each pillar includes a capacitor coupled to the second contact layer.

31. The memory device of claim 28, wherein each single crystalline vertical body region has a vertical length of less than 100 nanometers.

32. The memory device of claim 28, wherein each single crystalline vertical transistors has a vertical length of less than 100 nanometers and a horizontal width of less than 10 nanometers.

33. A memory device, comprising:
a folded bit line array of memory cells, wherein each memory cell in the array of memory cells includes:
a pillar extending outwardly from a semiconductor substrate, wherein the pillar includes a single crystalline first contact layer and a single crystalline second contact layer separated by an oxide layer;
a pair of single crystalline vertical transistors formed along opposing sides of each pillar, wherein each single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions;
a plurality of buried bit lines formed of single crystalline semiconductor material and disposed below the pillars in the array memory cells for interconnecting with the first contact layer of column adjacent pillars in the array of memory cells; and
a plurality of first word lines, each first word line disposed orthogonally to the plurality of buried bit lines in a trench between rows of the pillars for addressing body regions of the single crystalline vertical transistors in alternating row adjacent pillars that are adjacent to a first side of the trench; and
a plurality of second word lines, each second word line disposed orthogonally to the bit lines in the trench between rows of the pillars and separated from each first word line by an insulator such that the second wordline is adjacent a second side of the trench and addresses body regions of the single crystalline vertical transistors in alternating row adjacent pillars that are adjacent to a second side of the trench.

34. The memory device of claim 33, wherein each of the plurality of first wordlines integrally forms a gate for addressing the body region in a pillar on a first side of the trench and is isolated by an insulator layer from the body region in a row adjacent pillar on the first side of the trench.

35. The memory device of claim 33, wherein each of the plurality of second wordlines integrally forms a gate for addressing the body region in a pillar on a second side of the trench and is isolated by an insulator layer from the body region in a row adjacent pillar on the second side of the trench.

36. The memory device of claim 33, wherein each of the plurality of first and second word lines includes a vertically oriented word line having a vertical length of less than 100 nanometers.

37. The memory device of claim 33, wherein each single crystalline vertical transistors has a vertical length of less than 100 nanometers and a horizontal width of less than 10 nanometers.

38. An electronic system, comprising:
a processor; and
a folded bit line DRAM device coupled to the processor, wherein the folded bit line DRAM device includes:
an array of memory cells formed in rows and columns, wherein each memory cell in the array of memory cells includes:
a pillar extending outwardly from a semiconductor substrate, wherein the pillar includes a single crystalline first contact layer and a single crystalline second contact layer separated by an oxide layer;
a single crystalline vertical transistor formed along alternating sides of the pillar within a row of pillars, wherein the single crystalline vertical transistor includes;
an ultra thin single crystalline vertical first source/drain region coupled to the first contact layer;
an ultra thin single crystalline vertical second source/drain region coupled to the second contact layer;
an ultra thin single crystalline vertical body region which opposes the oxide layer and couples the first and the second source/drain regions; and
wherein a surface space charge region for the single crystalline vertical transistor scales down as other dimensions of the transistor scale down;
a plurality of buried bit lines formed of single crystalline semiconductor material and disposed below the pillars in the array memory cells for interconnecting with the first contact layer of column adjacent pillars in the array of memory cells; and
a plurality of word lines, each word line disposed orthogonally to the plurality of buried bit lines in a trench between rows of the pillars for addressing alternating body regions of the single crystalline vertical transistors that are adjacent to the trench.

* * * * *